(12) United States Patent
Travis

(10) Patent No.: US 7,924,099 B2
(45) Date of Patent: Apr. 12, 2011

(54) METHOD OF ESTABLISHING AN OSCILLATOR CLOCK SIGNAL

(76) Inventor: Christopher Julian Travis, Wotton-under-Edge (GB)

( * ) Notice: Subject to any disclaimer, the term of this patent is extended or adjusted under 35 U.S.C. 154(b) by 0 days.

(21) Appl. No.: 12/352,157

(22) Filed: Jan. 12, 2009

(65) Prior Publication Data

US 2009/0121792 A1 May 14, 2009

Related U.S. Application Data

(63) Continuation of application No. 10/552,364, filed as application No. PCT/GB03/01441 on Apr. 2, 2003, now Pat. No. 7,495,516.

(51) Int. Cl.
*H03L 7/24* (2006.01)
(52) U.S. Cl. ............. 331/18; 331/47; 327/106; 375/371
(58) Field of Classification Search .................... 331/18, 331/46, 47; 327/105–107; 375/371; 708/271, 708/276
See application file for complete search history.

(56) References Cited

U.S. PATENT DOCUMENTS

| | | | | |
|---|---|---|---|---|
| 4,652,832 A * | 3/1987 | Jasper | ............................ | 327/106 |
| 4,888,564 A | 12/1989 | Ishigaki | | |
| 4,901,265 A | 2/1990 | Kerr et al. | | |
| 4,970,474 A | 11/1990 | Kennedy et al. | | |
| 5,394,106 A * | 2/1995 | Black et al. | .................... | 327/107 |
| 5,625,358 A | 4/1997 | Wilson et al. | | |
| 5,638,010 A | 6/1997 | Adams | | |
| 5,790,614 A | 8/1998 | Powell | | |
| 5,825,253 A | 10/1998 | Mathe et al. | | |
| 5,977,804 A * | 11/1999 | Beech | ............................ | 327/107 |
| 5,986,512 A | 11/1999 | Eriksson | | |
| 6,075,474 A | 6/2000 | Gabet et al. | | |
| 6,094,569 A | 7/2000 | Wang | | |
| 6,262,604 B1 * | 7/2001 | Gabet et al. | .................... | 327/107 |
| 6,396,313 B1 * | 5/2002 | Sheen | ............................ | 327/105 |
| 6,611,175 B2 | 8/2003 | Heymann | | |
| 6,674,332 B1 | 1/2004 | Wunner et al. | | |

(Continued)

FOREIGN PATENT DOCUMENTS

EP 0 526 227 2/1993

(Continued)

OTHER PUBLICATIONS

International Search Report: PCT/GB03/01441; Nov. 5, 2003.

*Primary Examiner* — Robert Pascal
*Assistant Examiner* — Levi Gannon
(74) *Attorney, Agent, or Firm* — Cantor Colburn LLP

(57) ABSTRACT

A hybrid numeric-analog clock synchronizer, for establishing a clock or carrier locked to a timing reference. The clock may include a framing component. The reference may have a low update rate. The synchronizer achieves high jitter rejection, low phase noise and wide frequency range. It can be integrated on chip. It may comprise a numeric time-locked loop (TLL) with an analog phase-locked loop (PLL). Moreover a high-performance number-controlled oscillator (NCO), for creating an event clock from a master clock according to a period control signal. It processes edge times rather than period values, allowing direct control of the spectrum and peak amplitude of the justification jitter. Moreover a combined clock-and-frame asynchrony detector, for measuring the phase or time offset between composite signals. It responds e.g. to event clocks and frame syncs, enabling frame locking with loop bandwidths greater than the frame rate.

20 Claims, 18 Drawing Sheets

U.S. PATENT DOCUMENTS 6,833,764 B1 12/2004 Dean

FOREIGN PATENT DOCUMENTS

| EP | 0 698 968 | 2/1996 |
| EP | 1 104 111 | 5/2001 |
| EP | 1 160 984 | 12/2001 |
| WO | WO 94/26033 | 11/1994 |
| WO | WO 99/33182 | 1/1999 |
| WO | WO 00/18008 | 3/2000 |

* cited by examiner

Master Clock

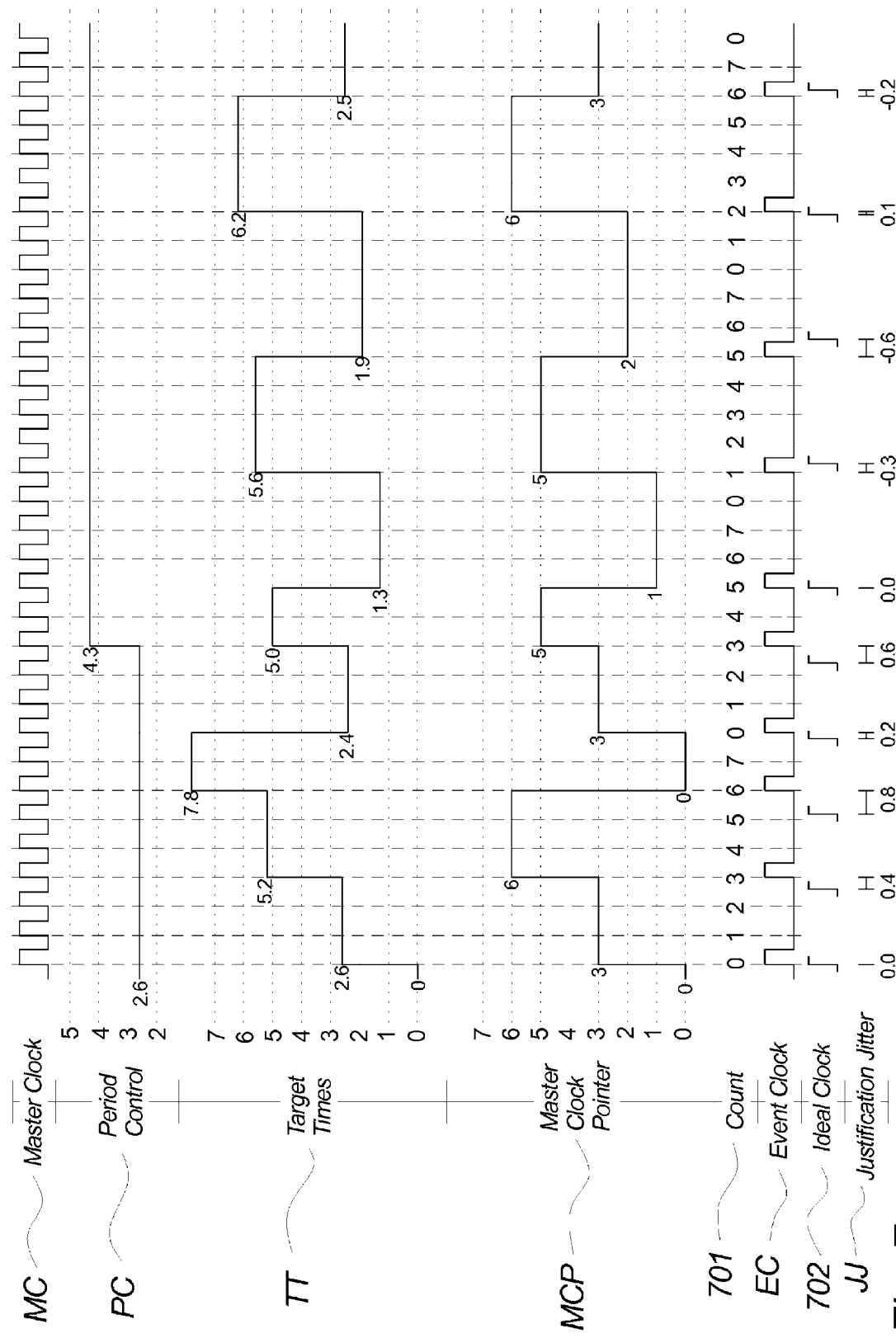

METHOD OF ESTABLISHING AN OSCILLATOR CLOCK SIGNAL

CROSS REFERENCE TO RELATED APPLICATIONS

This application is a Continuation of U.S. application Ser. No. 10/552,364, filed Jun. 9, 2006, which is a National Stage Application of PCT/GB03/01441 filed on Apr. 2, 2003. The contents of U.S. application Ser. No. 10/552,364 and PCT/GB03/01441 are incorporated by reference herein in their entirety.

FIELD OF THE INVENTION

The present invention relates to the establishment of clocks and carriers that are phase/time locked, frequency locked or frequency ratio locked to timing reference signals.

BACKGROUND OF THE INVENTION

In electronic systems, clocks and carriers abound. They are the heartbeat of synchronous circuits such as microprocessors. They are used to construct communications signals for transmission, and to recover data from received signals. They regulate the sampling of continuous-time signals, and the conversion of discrete-time signals into continuous-time form. They are modulated to carry information in elevated frequency bands, and are instrumental in demodulation.

Clock quality has a direct bearing on system performance, e.g. operating margin, signal-to-noise ratio, spectral efficiency etcetera. Applications involving e.g. digital audio signals or radio-frequency communications can place particularly stringent limits on clock jitter and carrier phase noise. Aspects relating to flexibility and cost are also very important in most applications.

It is a common desire or requirement that a clock be synchronized to another clock, or to a timing reference of more general form. This applies for example when digital audio and video signals are communicated in real time. The design of clock synchronizing circuits is an established field, and many types of clock synchronizer are known within the art. Examples include various classes of phase-locked loop (PLL), direct digital synthesizer (DDS) and anti-jitter circuit (AJC).

Clock synchronization encompasses phase locking, frequency locking and frequency ratio locking. Hence it includes reference-locked frequency synthesis.

In phase-locked loops, the clock is provided by a controllable oscillator that is pulled into lock by the action of feedback. The feedback path optionally includes a frequency divider. A phase detector compares the divided clock with the timing reference, and generates an error signal representing their phase offset. This error signal drives a loop filter, the output of which is connected to the oscillator's frequency control port.

Below the PLL's closed-loop corner frequency, jitter on the timing reference passes straight to the clock. Above its corner frequency, the oscillator's intrinsic jitter passes straight to the clock. In setting the loop bandwidth the designer must find a compromise between the need for good reference jitter attenuation and the need for low PLL intrinsic jitter. If a high-Q oscillator is used, such as a voltage-controlled crystal oscillator (VCXO), the PLL can have narrow bandwidth and low jitter. However, VCXOs can be pulled only over a narrow frequency range. Also, they are relatively expensive and cannot be implemented on chip. Conversely, low-Q oscillators such as ring oscillators have wide frequency range and are fully integrable, but their high self-noise and their sensitivity to interference makes them only suited to use in wide-bandwidth PLLs.

When the timing reference is clean and fast, there is no problem with using a wide-bandwidth PLL. This is the case in many standalone frequency synthesizers, for example, where the reference is typically a local crystal oscillator. However, it is not the case in most other applications. The timing reference is often a low-rate signal, e.g. because of limited capacity in the channel from the timing master. Also it is often of relatively low quality, due to imperfect characteristics of that channel.

Frame locking is also a requirement in many systems. This too has tended to keep the rate of timing reference signals down. Many de-facto timing references consist only of a framing component, on the basis that this is all that is needed. Frame rates are often quite low, e.g. 8 kHz in telecom systems.

One way of constructing a clock synchronizer that can meet the conflicting requirements outlined above would be to make use of direct digital synthesis (DDS). In direct digital synthesizers a numeric oscillator generates a digital representation of a sinewave which is then passed through a digital-to-analog converter (DAC), filtered to remove spuriae, and compared with a DC value to create the desired squarewave. However, DDS is not without problems. One is the cost of the DAC. Others relate to finite wordlength effects, inadequate reconstruction filtering, and susceptibility to interference at the point where the sinewave is turned into a squarewave.

The cost of the DAC, the filter and the comparator can be avoided by taking the sign of the numeric oscillator's output, and using that as the clock. However, such number-controlled oscillators (NCOs) suffer greatly from beat-frequency effects. Superior number-controlled oscillators are known within the art, but even they have certain shortcomings. Wholly numeric PLLs constructed around such oscillators generally suffer from an excess of high-frequency jitter, compared with analog PLLs. On the other hand, they are easy to test, need no calibration, have great repeatability, and present the opportunity to add many advanced features at little incremental cost. For example, accurate frequency holdover is straightforward with numeric PLLs, and rapid locking, e.g. by bandwidth adaption, poses far fewer problems than in analog.

An object of the invention may include one or several of the below-stated provisions of:

A clock synchronizer/synthesizer that has high performance, high flexibility and low implementation cost.

A clock synchronizer/synthesizer that achieves the high performance of VCXO-based PLLs without incurring the cost of a VCXO.

A clock synchronizer/synthesizer that has less low-frequency intrinsic jitter (close-in phase noise) than VCXO-based PLLs.

A clock synchronizer/synthesizer that has narrow bandwidth, low intrinsic jitter and a wide range of operating frequencies.

A narrow-bandwidth low-jitter wide-range clock synchronizer/synthesizer that can smoothly track large changes in reference frequency.

A ring-oscillator-based clock synchronizer/synthesizer that has higher performance than previous ring-oscillator-based clock synchronizers/synthesizers.

A clock synchronizer/synthesizer that is readily integrable on chip using common processes and building blocks.

A clock synchronizer/synthesizer that is less sensitive to interference and layout than previous clock synchronizers.

A clock synchronizer/synthesizer that combines the good features of numeric PLLs with the good features of analog PLLs.

A clock synchronizer/synthesizer that achieves the performance and flexibility of DDS-based clock synchronizers without incurring the cost of a DAC.

A number-controlled oscillator that has higher performance, higher flexibility and lower cost than previous number-controlled oscillators.

An asynchrony detector that has novel capabilities relating to frame locking.

SUMMARY OF THE INVENTION

The invention relates to a method of establishing an output clock signal (OC) on the basis of an input timing reference (TR), said method comprising the steps of attenuating jitter of said input timing reference (TR) to produce a control signal (103), providing at least one intermediate clock signal (IC) on the basis of said control signal (103), at least one of said intermediate clock signals (IC) being justified to a local clock (LC) and being spectrum controlled, and providing said output clock signal (OC) on the basis of said at least one intermediate clock signal (IC) by attenuating jitter of said at least one intermediate clock signal (IC).

According to the invention several advantages may been obtained, such as high quality output clock signals provided by a circuit, which may be integrated on-chip high flexibility with respect to the nature of the input timing reference has been obtained. According to the invention, a great variety of input frequencies may be locked to due to the fact the generation of different frequencies is not directly derived from a reference oscillator clock.

low cost implementation. The components, e.g. a numeric clock renderer adapted for the purpose of generating the intermediate clock on the basis of the input timing reference are by nature low-cost components, which may moreover be integrated on-chip. The components adapted for attenuating the jitter, typically the intrinsic jitter of the numeric clock renderer may also comprise relatively simple and low cost components in the sense that requirements to the bandwidth of the out filters are relatively relaxed in the sense that the intrinsic noise of the circuit according to the invention has been spectrum controlled previously to the final attenuation of the (typically intrinsic) jitter According to the invention, the output clock signal may comprise several clock components such as an output event clock and an output frame sync.

According to a preferred embodiment of the invention, on-chip design may be facilitated by the fact that the analog filters may be implemented by means of relatively small-value components in combination with a numeric oscillator, which by nature is well suited for on-chip implementation.

In this context it should be noted that numeric oscillators and small-value analog components per se are low-cost components.

When at least a part of the jitter of said at least one intermediate clock signal (IC) comprises justification jitter (JJ) originating from said justification to said local clock (LC), a further advantageous embodiment of the invention has been obtained.

When said justification and spectrum control is performed numerically, a further advantageous embodiment of the invention has been obtained.

When said attenuation of jitter of said input timing reference (TR) is performed by using low-pass filtering, a further advantageous embodiment of the invention has been obtained.

When said justification is performed by means of a number-controlled oscillator (NCO), a further advantageous embodiment of the invention has been obtained.

When a control input of said number-controlled oscillator (NCO) comprises a period control input, a further advantageous embodiment of the invention has been obtained.

When said spectrum control comprises dithering, a further advantageous embodiment of the invention has been obtained.

When whereby said spectrum control comprises noise shaping, a further advantageous embodiment of the invention has been obtained.

When said local clock (LC) is derived from or comprises a stable reference clock (SC), a further advantageous embodiment of the invention has been obtained.

When said stable reference clock (SC) comprises a crystal oscillator, a further advantageous embodiment of the invention has been obtained.

When said local clock (LC) is derived from said output clock signal (OC), a further advantageous embodiment of the invention has been obtained.

When said attenuation of jitter of said input timing reference (TR) is performed by means of a first block (FBLK), which preferably comprises a time-locked loop, with reference to a stable reference clock (SC), a further advantageous embodiment of the invention has been obtained.

When at least a part of said justification jitter (JJ) is biased into a higher frequency band, a further advantageous embodiment of the invention has been obtained.

When said justification jitter (JJ) is low-pass filtered by means of a second block (SBLK), which preferably comprises a phase-locked loop, a further advantageous embodiment of the invention has been obtained.

When said second block (SBLK) produces a multiplied clock (OEC), a further advantageous embodiment of the invention has been obtained.

When said second block (SBLK) further produces a frame signal (OFS), said frame signal (OFS) being established by means of frequency division of said multiplied clock (OEC), a further advantageous embodiment of the invention has been obtained.

When each of said intermediate clock signals (IC) is established by means of at least one numeric stage (FBLK), a further advantageous embodiment of the invention has been obtained According to this preferred embodiment of the invention, the intermediate clock signal is provided by means of a relatively simple, cost-effective and most of all flexible numeric stage on the basis of numeric control.

By applying a numerically controlled input stage, the circuit may receive and lock to frequencies in a relatively broad frequency band. Evidently, such feature is of a great importance, if the current application e.g. requires different sampling frequencies, which may hardly be obtained on the basis of the same reference frequency.

According to this preferred embodiment of the invention a numeric stage should preferably comprise a number-controlled oscillator.

When said attenuating jitter of said at least one intermediate clock signal (IC) is performed by means of at least one analog stage (SBLK), a further advantageous embodiment of the invention has been obtained.

When said at least one analog stage (SBLK) is adapted for attenuating jitter partly or mainly originating from said at least one numeric stage (FBLK), a further advantageous embodiment of the invention has been obtained.

When each of said intermediate clock signals (IC) is justified to a corresponding local clock (LC) and justification jitter associated with said justification to said local clock (LC) is spectrum controlled, a further advantageous embodiment of the invention has been obtained.

When at least one of said intermediate clock signals (IC) comprises an intermediate event clock component (IEC) and an intermediate framing component (IFS), said intermediate framing being established on the basis of said intermediate event clock by means of frequency division, a further advantageous embodiment of the invention has been obtained.

When said output clock signal (OC) comprises an output event clock component (OEC) and an output framing component (OFS), said output framing being established on the basis of said output event clock by means of frequency division, a further advantageous embodiment of the invention has been obtained.

Moreover, the invention relates to a method of establishing an event clock (EC) comprising a stream of event-clock pulses (ECP1 . . . ECPn)

on the basis of a master clock (MC) and on the basis of a stream of period control representations (PCR1 . . . PCRn), the values of said period control representations (PCR1 . . . PCRn) representing the desired period of the event clock (EC) with respect to that of the master clock (MC), whereby each of said event-clock pulses (ECP1 . . . ECPn) is established on the basis of an associated master-clock pointer (MCP), in which said master-clock pointers (MCP) form a stream of master-clock pointers (MCP), which stream is derived from said stream of period control representations (PCR1 . . . PCRn) by a process which comprises accumulation and resolution reduction and where an error signal associated with said resolution reduction is spectrum controlled.

According to the invention, a number-controlled oscillator has been obtained, having improved properties with respect to jitter.

An important feature of the invention is that the running establishment of the desired event clock is performed on the basis of not only the current period control representation but also on the basis of at least one previous period control representation. In other words, the running establishment of the event clock features a suppressing of jitter memory.

The desired period may e.g. comprise the strict desired period of the event clock or e.g. the desired mean period of the event clock.

The desired period defined by the period control representations may typically be expressed as a ratio between the desired event clock period and the master clock period.

According to a preferred embodiment of the invention, each event clock period (ECP1 . . . ECPn) is typically established on the basis of just one associated master-clock pointer (MCP). However, obviously, several master-clock pointers may be used for the establishment of a single event clock period, e.g. one pointer defining the rising edge and another pointer defining the falling edge.

According to a preferred embodiment of the invention, master-clock pointers may be regarded as associated very specifically to the specific periods of the master clock.

In other words the master-clock pointers may be regarded as some sort of indexed reference by means of which an event clock may be established.

According to a preferred embodiment of the invention, the accumulation comprises an accumulation, integration or running sum of the period control representations, or derivatives thereof. It is noted that accumulation, integration and utilization of a running sum may be regarded more or less equivalent.

When said accumulation precedes said resolution reduction, a further advantageous embodiment of the invention has been obtained.

When said resolution reduction precedes said accumulation, a further advantageous embodiment of the invention has been obtained.

When said resolution reduction may comprise wordlength reduction, quantization, truncation or rounding, a further advantageous embodiment of the invention has been obtained.

According to a preferred embodiment of the invention, the resolution reduction comprises a resolution reduction, wordlength reduction, quantization, truncation, rounding, etc. of the period control representations, or derivatives thereof, typically invoked by the fact that period control representations or derivatives thereof may have fractional resolution.

When said event-clock pulses (ECP1 . . . ECPn) are justified to edges of said master clock (MC), a further advantageous embodiment of the invention has been obtained.

According to the invention, a justified signal is a signal of which each of the events (e.g. edges of a square pulse signal) is co-timed with an associated event (e.g. edges of square pulse signal) from the master clock.

When the method of establishing an event clock (EC) comprises the steps of establishing a representation of an idealized clock comprising a stream of target times (TT) on the basis of period control representations (PCR1 . . . PCRn), justifying said idealized clock to said master clock (MC) while performing spectrum control of the associated justification jitter, thereby facilitating number-controlled oscillation with improved control of said justification jitter, a further advantageous embodiment of the invention has been obtained.

When said period control representations (PCR1 . . . PCRn) are digital, a further advantageous embodiment of the invention has been obtained.

When said period control representations (PCR1 . . . PCRn) are analog, a further advantageous embodiment of the invention has been obtained.

When said period control representations (PCR1 . . . PCRn) are consecutive components of a discrete-time period control representation signal (PCR), a further advantageous embodiment of the invention has been obtained.

When said master-clock pointers (MCP) are established on the basis of multiple previous period control representations (PCR1 . . . PCRn), a further advantageous embodiment of the invention has been obtained.

When said master-clock pointers (MCP) are established on the basis of multiple previous period control representations (PCR1 . . . PCRn) thereby facilitating a continuous accurate establishment of event-clock pulses (ECP1 . . . ECPn), a further advantageous embodiment of the invention has been obtained.

When said master-clock pointers (MCP) are established on the basis of at least two previous period control representations (PCR1 . . . PCRn) thereby facilitating accurate control of the mean period between consecutive event-clock pulses (ECP1 . . . ECPn), a further advantageous embodiment of the invention has been obtained.

According to the invention, the resulting jitter should preferably be related to an absolute, in principle infinite, track of the jitter. This may advantageously be obtained by a running integration of all or a large number of the previous period control representations.

According to the invention, the running integration or track record should basically only be able to keep track of the running control representations back to last time the integral (=summing) established an event clock event at exactly the time for the associated ideal event clock event.

In practice, an integration/summing of the period control representation should ensure that the numeric establishment of the event clock does not integrate the jitter error by for instance a continuous resetting of for example a counter based clock renderer every time a new event clock signal has been established.

When said master-clock pointers (MCP) are established on the basis of all previous period control representations (PCR1 . . . PCRn), a further advantageous embodiment of the invention has been obtained.

When said master-clock pointers (MCP) are established on the basis of integrated period control representations (PCR1 . . . PCRn), a further advantageous embodiment of the invention has been obtained.

When said master clock (MC) comprises a single-wire clock, a further advantageous embodiment of the invention has been obtained.

When said master clock (MC) comprises a multiphase clock, a further advantageous embodiment of the invention has been obtained.

When said master clock (MC) comprises a sequence of master-clock edges, a further advantageous embodiment of the invention has been obtained.

When a master-clock edge addresser (CR) is synchronized with a master clock (MC) thereby facilitating the selection of those of said master-clock edges that are pointed to by said master-clock pointers (MCP), a further advantageous embodiment of the invention has been obtained.

When said master-clock edge addresser (CR) comprises a counter (CNT) and a comparator (COM), a further advantageous embodiment of the invention has been obtained.

When said master-clock edge addresser (CR) comprises a multiplexer (MPX), a further advantageous embodiment of the invention has been obtained.

When said master-clock edge addresser (CR) comprises a differentiator and a multi-modulus divider, a further advantageous embodiment of the invention has been obtained.

When said period control representations (PCR1 . . . PCRn) are established on the basis of a period control input (PC), a further advantageous embodiment of the invention has been obtained.

When said period control input (PC) comprises a continuous-time signal, a further advantageous embodiment of the invention has been obtained.

When said period control input (PC) comprises an analog signal, a further advantageous embodiment of the invention has been obtained.

When said period control representations (PCR1 . . . PCRn) comprise numeric representations of said period control input (PC), a further advantageous embodiment of the invention has been obtained.

When said period control representations (PCR1 . . . PCRn) comprise said period control input (PC), a further advantageous embodiment of the invention has been obtained When the process of establishing said master-clock pointers (MCP) comprises quantization, a further advantageous embodiment of the invention has been obtained.

When the quantization error is subject to spectrum control, a further advantageous embodiment of the invention has been obtained.

When said spectrum control comprises dithering, a further advantageous embodiment of the invention has been obtained.

When said spectrum control comprises noise shaping, a further advantageous embodiment of the invention has been obtained.

When said spectrum control comprises dithering and noise shaping, a further advantageous embodiment of the invention has been obtained.

When the resolution of said period control representations (PCR1 . . . PCRn) is greater than the resolution of said master-clock pointers (MCP), a further advantageous embodiment of the invention has been obtained.

Moreover, the invention relates to a clock synchronizer for establishment of an output clock signal (OC) according to any of the claims regarding a method of establishing an output clock signal.

When said clock synchronizer further comprises a number-controlled oscillator (NCO) according to any of the claims regarding a method of establishing an event clock, a further advantageous embodiment of the invention has been obtained.

When said clock synchronizer further comprises a circuit for attenuating jitter of an input timing reference (TR), and said circuit comprises a number-controlled oscillator (NCO) adapted for establishment of an intermediate clock signal (IC) on the basis of said input timing reference (TR), a further advantageous embodiment of the invention has been obtained.

When said clock synchronizer further comprises jitter filtering means (SBLK) adapted for providing said output clock signal (OC) on the basis of said intermediate clock signal (IC), a further advantageous embodiment of the invention has been obtained.

Moreover, the invention relates to a number-controlled oscillator (NCO) comprising means for establishment of an event clock (EC) according to any of the claims regarding a method of establishing an event clock.

Moreover, the invention relates to a method of establishing at least one output signal (CDO) on the basis of at least two input signals (IS1, IS2),
where said input signals each comprise at least
a first component (IS1A, IS2A) and
a second component (IS1B, IS2B) and
where said output signal (CDO) is established fully or partly on the basis of the asynchrony said first components (IS1A, IS2A) of at least two of said input signals (IS1, IS2) when at least one first predefined criterion is fulfilled and
where said output signal (CDO) is established fully or partly on the basis of the asynchrony of said second components (IS1B, IS2B) of at least two of said input signals (IS1, IS2) when at least one second predefined criterion is fulfilled.

According to the invention, the same phase/time detector may basically at one time react fully or primarily on first signal components, e.g. event clocks, and at another time react fully or primarily on second signal components, e.g. frame syncs.

Evidently, according to the invention, the predefined applicable criteria for switching between reaction on the first signal components and reaction on the second signal components are numerous.

According to the invention the components of each input signal may be carried in any number of ways, including interleaved, as when the signal is a multiphase clock, and separately.

According to the invention, more than two components may be used as basis for the establishment of an output signal. An example of an application having two levels of framing, and thereby three clock components to synchronize, is a conventional CRT-monitor or TV. There are three signals controlling the drawing of pixels on the screen. The fastest signal, corresponding to the event clock component used in this description, defines each single pixel, with a pixel rate of e.g. 20-50 MHz. This signal is divided into groups by an H-sync (horizontal synchronization) signal, corresponding to the framing component used in this description. Each H-sync group comprises pixels for exactly one horizontal line on the screen, i.e. the H-sync signal indicates when to change to the next line. The frequency of the H-sync signal is e.g. 15-30 kHz. The third signal V-sync (vertical synchronization) divides the H-sync signal into even longer frames, each comprising enough H-sync groups for exactly one screen image. The V-sync signal thus indicates when to start over from the first corner again, and its frequency is e.g. 25 Hz or 30 Hz for TV-screens and e.g. 75 Hz for PC-monitors.

When said at least one output signal (CDO) represents the phase angle between said at least two of said input signals, a further advantageous embodiment of the invention has been obtained.

When said at least one output signal (CDO) represents the time interval between said at least two of said input signals, a further advantageous embodiment of the invention has been obtained.

When said input signals (IS1, IS2) are mutually asynchronous, a further advantageous embodiment of the invention has been obtained.

When said first components (IS1A, IS2A) of said input signals (IS1, IS2) comprise event-clock-representative components, a further advantageous embodiment of the invention has been obtained.

When said second components (IS1B, IS2B) of said input signals (IS1, IS2) comprise frame-sync-representative components, a further advantageous embodiment of the invention has been obtained.

When at least one of said input signals (IS1, IS2) comprises feedback signals of a phase-locked loop, a further advantageous embodiment of the invention has been obtained.

When at least one of said input signals (IS1, IS2) comprises feedback signals of a time-locked loop, a further advantageous embodiment of the invention has been obtained.

When said first and second components of at least one of said input signals (IS1, IS2) are inherent in a multiphase representation of that signal, a further advantageous embodiment of the invention has been obtained.

When said first and second components of at least one of said input signals (IS1, IS2) comprise two separately wired signals, a further advantageous embodiment of the invention has been obtained.

When said first and second components of at least one of said input signals (IS1, IS2) are comprised in a composite signal, a further advantageous embodiment of the invention has been obtained.

When said first predefined criterion comprises said asynchrony of said second components (IS1B, IS2B) substantially being smaller than the period of one of said first components (IS1A, IS2A), a further advantageous embodiment of the invention has been obtained.

When said second predefined criterion comprises said asynchrony of said second components (IS1B, IS2B) substantially exceeding the period of one of said first components (IS1A, IS2A), a further advantageous embodiment of the invention has been obtained.

When at least one of said predefined criteria is established on the basis of the reliability of at least one of said components (IS1A, IS1B, IS2A, IS2B), a further advantageous embodiment of the invention has been obtained.

According to this preferred embodiment of the present invention, reliability of one or more signal components may e.g. refer to lack of frame sync, disruptions, temporary unavailability, undecodable frame sync modulation, etc.

When at least one of said predefined criteria is established on the basis of a quality measure that relates to the performance of a system applying said method, a further advantageous embodiment of the invention has been obtained.

According to this preferred embodiment of the present invention, the criteria may refer to performance or attributes of other system components or even system-wide.

E.g. circuits, which regarding to signal flow precede the circuit implementing the method of the present invention, may supply to the method of the present invention knowledge of component or signal qualities, thus facilitating the method of the present invention to more efficiently and correctly choose the best signal component for phase locking, possibly according other aspects as well.

Also circuits that succeed the circuit implementing the method of the present invention may be implemented to control the criteria, e.g. by sending back information in relation to bit error ratio on received signal, etc.

When said second component (IS1B, IS2B) groups an integer number of clock events of said first components (IS1A, IS2A) into frames and where said number is greater than two, a further advantageous embodiment of the invention has been obtained.

Moreover the invention relates to an asynchrony detector (CD) comprising means for establishing at least one output signal (CDO) according to the method of establishing at least one output signal.

When said asynchrony detector (CD) further comprises filtering means (SLF) for filtering said output signal (CDO), a further advantageous embodiment of the invention has been obtained.

When said output signal (CDO) is used as control signal for an oscillator (VCO), a further advantageous embodiment of the invention has been obtained.

According to the invention, many applications use or may use a phase detector or a time detector to control an oscillator.

When said asynchrony detector forms part of a phase-locked loop, a further advantageous embodiment of the invention has been obtained.

When said asynchrony detector forms part of a time-locked loop, a further advantageous embodiment of the invention has been obtained.

According to the invention, a phase-locked loop or time-locked loop using the asynchrony detector of the present invention is able to lock not only to an event clock, but also to an associated frame sync, simultaneously.

When said output signal (CDO) is established by means of
   at least two synchronous state machines (RSSM, FSSM),
      each acting on one of said input signals (IS1, IS2) and on at least one signal from at least one other of said synchronous state machines (RSSM, FSSM),
   at least one frame offset counter (FOC),
   at least one combinatorial block (CMB) adapted to process event count values derived from said synchronous state machines (RSSM, FSSM) and to process force signals (FUP, FDN) derived from said frame offset counter (FOC), a further advantageous embodiment of the invention has been obtained.

According to the invention, this embodiment facilitates fast and smooth clock and frame locking.

When said output signal (CDO) is established by means of a set of at least two basic asynchrony detectors (DET1, DET2, DET3, DETn), said set of detectors being adapted to act on multiphase clocks (MPIC, MPFC), a further advantageous embodiment of the invention has been obtained.

According to the invention, this embodiment directly enables the use of multiphase clocks, with their implicit framing component.

When at least one of said multiphase clocks (MPIC, MPFC) is established by means of a divider (RDIV, FDIV), a further advantageous embodiment of the invention has been obtained.

When said at least one output signal (CDO) is established by means of
at least one counter (RCTR, FCTR) and
a digital-to-analog converter (DAC),
a further advantageous embodiment of the invention has been obtained.

According to the invention, this embodiment facilitates frames with relatively great lengths.

When said at least one output signal (CDO) is established by means of combining the asynchrony detector of claim 82 or 83 with the asynchrony detector of claim 84, a further advantageous embodiment of the invention has been obtained.

Moreover the invention relates to a method of establishing an output clock signal (OC) according to any of the claims regarding a method of establishing an output clock signal, whereby said justification is performed by means of a number-controlled oscillator (NCO) according to any of the claims regarding a number-controlled oscillator.

When said second block (SBLK) comprises an asynchrony detector (CD) according to any of the claims regarding an asynchrony detector, a further advantageous embodiment of the invention has been obtained.

When said output clock signal (OC) is phase locked to said input timing reference (TR), a further advantageous embodiment of the invention has been obtained.

When said output clock signal (OC) is frequency locked to said input timing reference (TR), a further advantageous embodiment of the invention has been obtained.

When said output clock signal (OC) is frequency ratio locked to said input timing reference (TR), a further advantageous embodiment of the invention has been obtained.

BRIEF DESCRIPTION OF THE FIGURES

The invention will now be described with reference to the figures, where FIG. 7 is a timing diagram showing how the High-Performance NCO's signals progress.

DETAILED DESCRIPTION

Some Applications

Figure 1A:
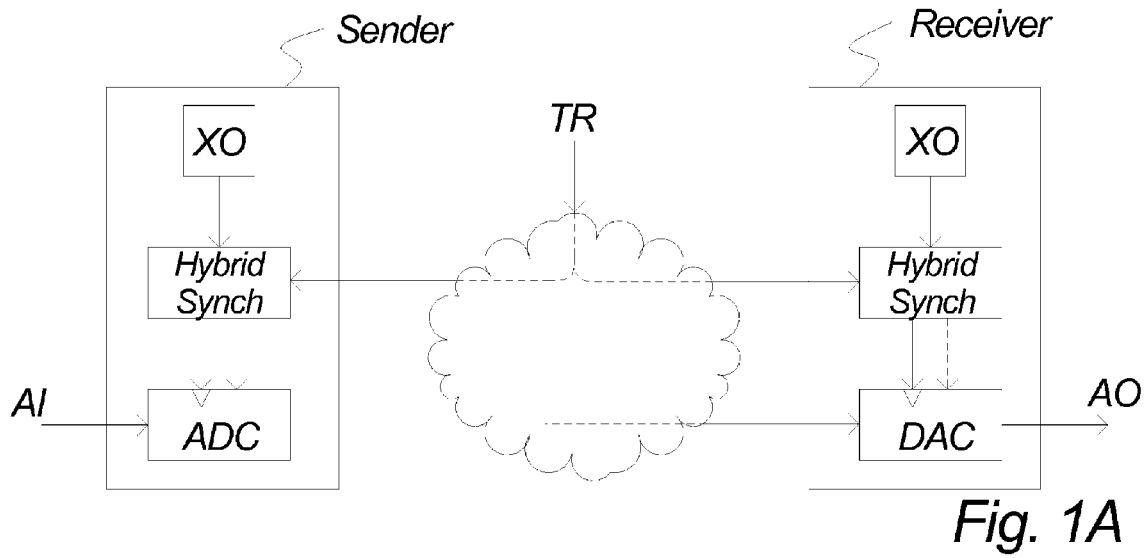
FIG. 1A-1B show two applications implementing the Hybrid Synchronizer of the present invention.
Figure 1B:
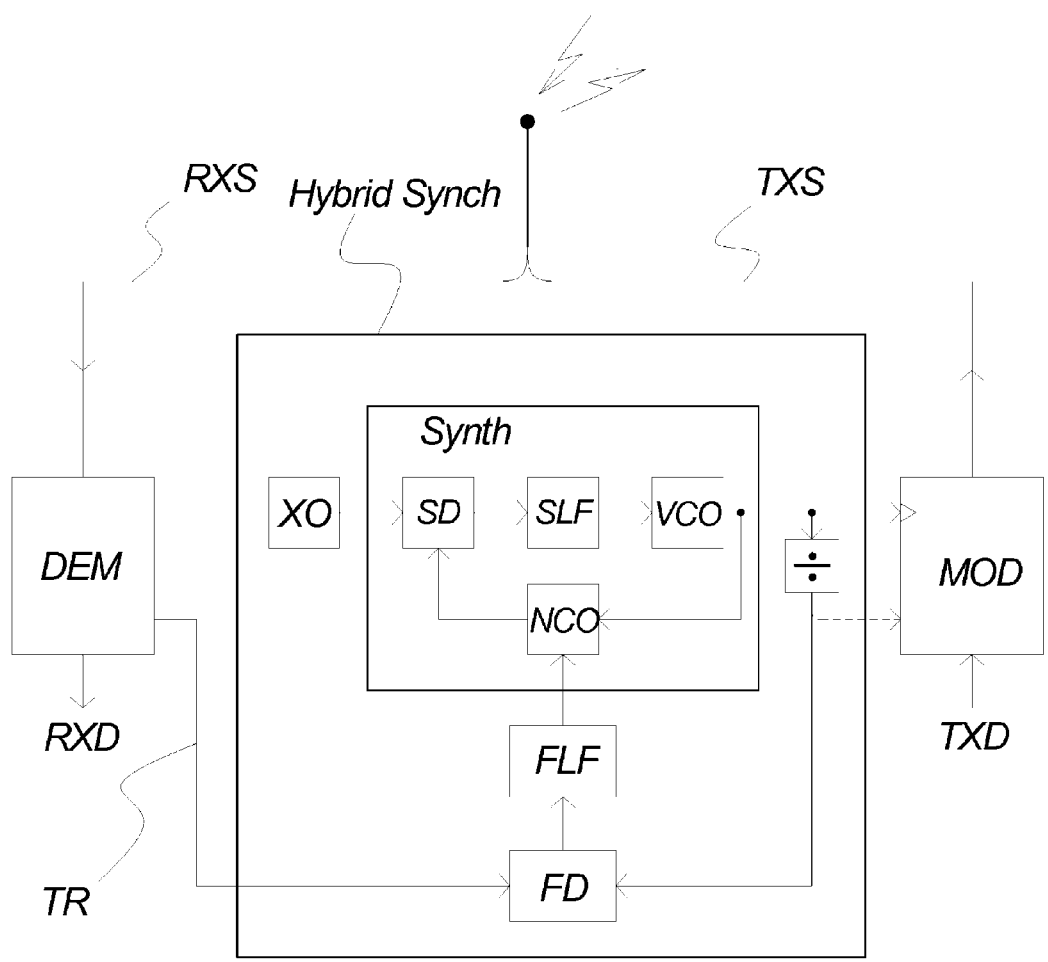

FIGS. 1A and 1B show two different applications implementing the hybrid numeric-analog clock synchronizer (Hybrid Synchronizer) of the present invention. The drawings are provided exclusively to show contextually examples of the present invention, and it is emphasized that the Hybrid Synchronizer of the present invention targets a wide range of applications from many different technical areas, and should not be restricted to the use shown in FIG. 1A, FIG. 1B or any other drawing provided with this description.

FIG. 1A shows an example of digital communication. It comprises a sender with an analog-to-digital converter ADC and a receiver with a digital-to-analog converter DAC. The ADC has an analog input AI, and the DAC has an analog output AO. The digitized signal from the ADC is routed to the DAC via a communications channel. The channel may be a wired or wireless link, bus, network etc. and may involve coding, packetization, buffering etc. The analog information on the analog input signal AI is transmitted as a digitized signal, and then output as analog information at the signal AO.

To ensure that the analog output AO equals the analog input AI, it is important that the clocks used by the ADC and the DAC are synchronized and have a low amount of jitter noise. This synchronization and low jitter is achieved flexibly and at low cost by using a Hybrid Synchronizer of the present invention to provide the clock, and optionally a framing component, to each converter. The two Hybrid Synchronizers are referred to a common timing reference TR. Each Hybrid Synchronizer also requires a stable clock, which is typically provided by a local free-running crystal oscillator XO, possibly via e.g. a clock multiplier or a delay-locked loop.

In the example of FIG. 1A the timing reference is provided by a separate device, not shown. Similar examples arise when it is instead provided by the receiver or by the sender. In the latter case the timing reference may be implicit in the digitized signal. It is further noted that the receiver may be one of several that are all receiving the same digital signal, e.g. in a broadcasting context, and that senders and receivers that can play back and store digital signals do not necessarily contain analog converters.

FIG. 1B shows an example of a transceiver, e.g. in a cable modem or a mobile phone. It comprises a modulator MOD for modulating data for transmission TXD to a transmission signal TXS, and a demodulator DEM for demodulating a received signal RXS to received data RXD. The transceiver is communicating with e.g. a base station (not shown). The signal for transmission is modulated according to a reference clock, which may for example be defined and maintained by the base station. A representation of that reference is inherent in the received signal RXS, and is thereby immediately present to the demodulator DEM. The extracted representation TR may possibly be in a poor condition, and suffering from jitter noise etc. To derive a high quality clock here from, for use with the modulator MOD, a Hybrid Synchronizer of the present invention is inserted. The extracted representation is used as input for the Hybrid Synchronizer, which locks to it, attenuates jitter and provides a high quality clock or carrier of appropriate frequency/phase, plus optional framing component, to the modulator MOD. More generally, the Hybrid Synchronizer might take part in the modulation process, e.g. implementing frequency hopping or phase modulation.

The motivation for locking the transceiver to the reference might be to tightly synchronize transmission to reception, which can allow more efficient use of the channel. Or, where transmission and reception are plesiochronous, the motivation might simply be to avoid the need for a close-tolerance reference oscillator in the transceiver.

A detailed description of the internal operation of the Hybrid Synchronizer is given below. The specific embodiment shown in FIG. 1B is below referred to as a coupled form of the Hybrid Synchronizer.

Hybrid Numeric-Analog Clock Synchronization

A clock synchronizer according to an embodiment of the present invention has a first block FBLK including a low-pass filter FLF, which attenuates mid- and high-frequency jitter from a received timing reference signal TR, and a second block SBLK, which attenuates high-frequency jitter from the first block. The first block FBLK outputs one or more intermediate clocks IC to the second block SBLK. The edges of each intermediate clock IC are justified to edges or interpolated phases of a local clock LC. A process in the first block controls the spectrum of the associated justification jitter, e.g. by dithering and/or noise shaping. The second block SBLK generates an output clock OC. The clock synchronizer acts to lock this output clock OC to the timing reference TR. Within the scope of such locking and synchronization are included phase/time locking, frequency locking and frequency ratio locking. In many applications, the output clock OC is a composite clock including a framing component OFS, which may be part of a time count. The clock synchronizer can lock this component to the timing reference TR. Generally, at least a part of the first block FBLK is numeric and operates in discrete time, and at least a part of the second block SBLK is analog and operates in continuous time.

Such a synchronizer may be referred to as a hybrid numeric-analog clock synchronizer, or just as a Hybrid Synchronizer.

Figure 2A:
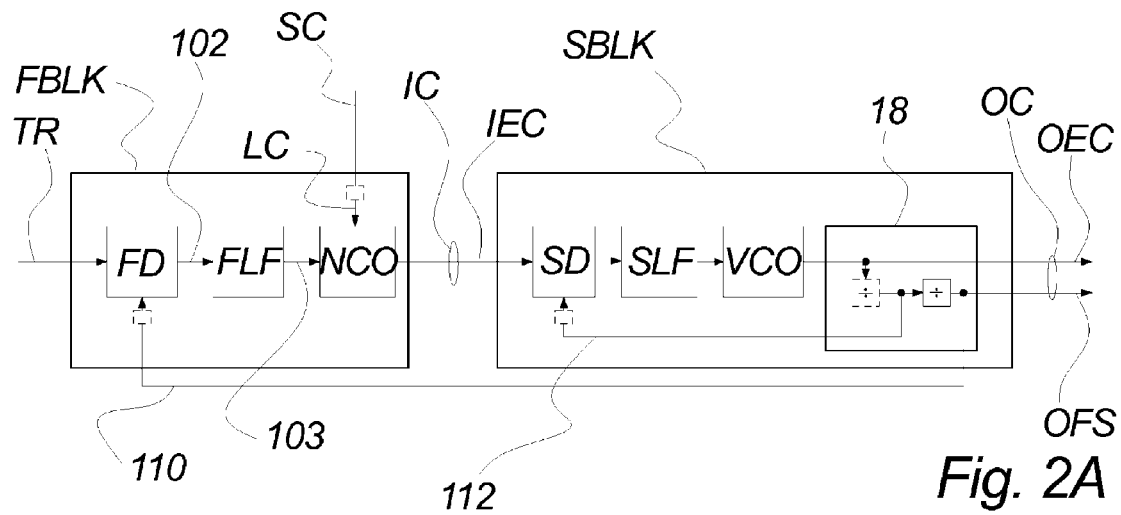
FIG. 2A shows a detailed nested-form embodiment of the Hybrid Synchronizer.
Figure 2B:
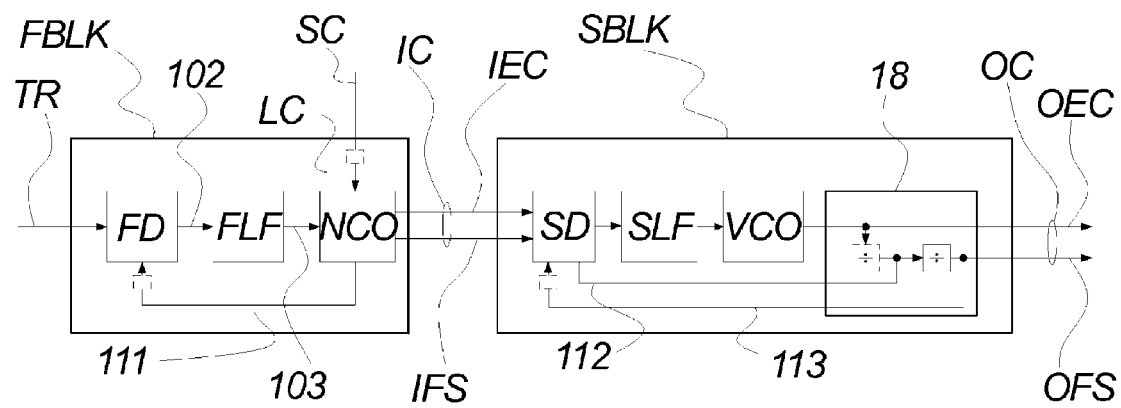
FIG. 2B shows a detailed cascade-form embodiment of the Hybrid Synchronizer.
Figure 2C:
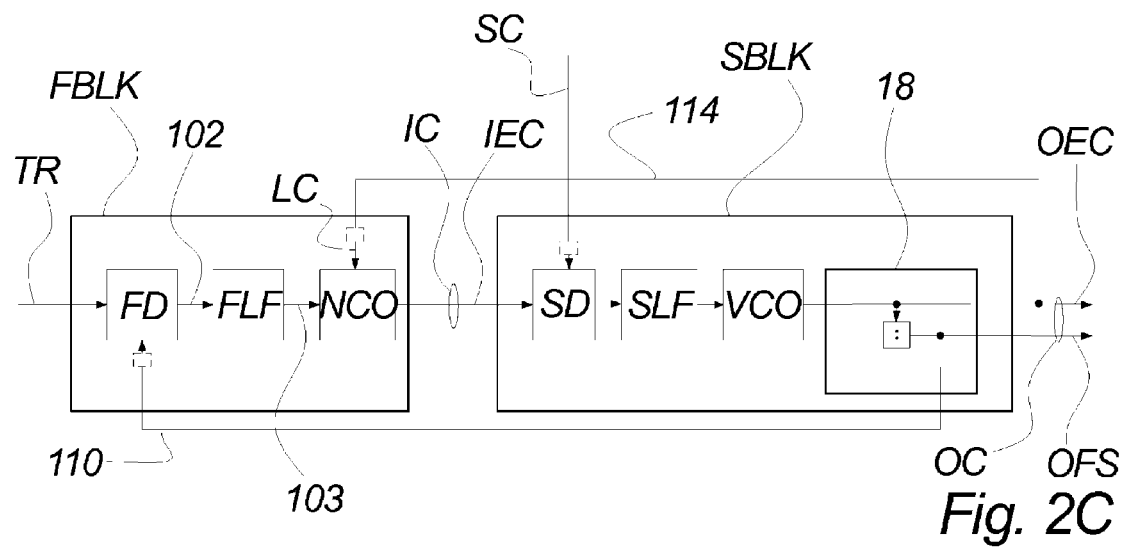
FIG. 2C shows a detailed coupled-form embodiment of the Hybrid Synchronizer.

FIGS. 2A-2C show embodiments illustrating different forms of the Hybrid Synchronizer of the present invention. They all comprise a first block FBLK and a second block SBLK. The first block FBLK comprises a first detector FD, a first loop filter FLF and a number-controlled oscillator NCO. The second block SBLK comprises a second detector SD, a second loop filter SLF, a voltage-controlled oscillator VCO and a divider block 18.

The first and second detectors FD, SD may be phase detectors, time detectors, frequency detectors, or any similar detectors. The first and second loop filters FLF, SLF are low-pass filters that may or may not have an integrating behaviour.

Note that other contents of the first and second blocks FBLK SBLK are possible and are within the scope of the invention. FIGS. 2A-2C serve the dual purposes of a) illustrating three different forms, which are distinguished by the ways in which the first and second blocks are connected, and b) showing one possible set of contents of the first and second blocks.

In these and other embodiments, the voltage-controlled oscillator VCO may be substituted by a current-controlled oscillator or any other oscillator that is wholly or largely analog.

In preferred embodiments of the Hybrid Synchronizer of the present invention, the output clock OC is a composite signal preferably comprising an output event clock component OEC, and an output framing component OFS. These components may each have their own separate wiring, or may be modulated into one composite signal, e.g. by using one or more of several possible conventional techniques, some of which are described later with reference to FIGS. 15A-15D. In RF applications the output event clock OEC may be e.g. sinusoidal rather than rectangular.

Also the signal connecting the two blocks, intermediate clock IC, may possibly and preferably be a composite signal, preferably comprising an intermediate event clock component IEC and an intermediate framing component IFS. Methods of physically comprising these components by the intermediate clock IC are fully equivalent to the methods described above for the composite output clock OC. It is noted that any suitable signal implementation may be used for the output clock OC and the intermediate clock IC, and that the implementations of each do not need to be the same. It is further noted that the intermediate event clock IEC may be a multi-part event clock on multiple wires, even when there is no associated frame sync IFS.

The embodiments of FIGS. 2A-2C differ only in how the above-mentioned blocks are connected. In the nested form, FIG. 2A, a feedback 110 to the first detector FD is from the divider block 18. With the cascade form, FIG. 2B, there is no feedback from the second block SBLK to the first block FBLK. Instead, both an intermediate event clock IEC and an intermediate frame sync IFS connect the two loops. The coupled form, FIG. 2C, has two feedback lines from the second block SBLK to the first block FBLK. One 114 is from the output event clock OEC to the number-controlled oscillator NCO, where it is used as local clock LC. The other 110 is from the divider block 18 to the first detector FD.

The embodiments of FIGS. 2A-2C can be used for phase/time locking, frequency locking or frequency ratio locking. In applications that do not require phase/time locking, e.g. reference-locked frequency synthesis, the cascade form can be simplified by omitting the intermediate frame sync IFS.

The timing reference TR may take many forms, including irregular forms such as MPEG-2 Systems program/system clock references, which are streams of reference timestamp values. The first detector's feedback signal 110 111 may also take many forms, as is indicated for example in the description that accompanies FIG. 13.

Additional stages such as frequency dividers, saturation limiters, quantizers, ADCs and DACs can be inserted at various places in the embodiments shown in FIGS. 2A-2C without affecting the basic operation or novelty of the circuits.

In addition to the three Hybrid Synchronizer forms illustrated in FIGS. 2A-2C, other forms are possible, still within the scope of the present invention. Such forms may be derived e.g. by adding a second number-controlled oscillator to the circuit, inserting it in the path feeding the second input of the second detector SD. The resulting forms, which have two intermediate clocks IC, can be regarded as crosses between the nested/cascade form and the coupled form.

In preferred embodiments, the first block FBLK is entirely numeric, and the second block SBLK is partly digital and partly analog. Specifically, the second detector is preferably digital and the second loop filter SLF is preferably of the integrator-plus-lead-lag type, incorporating at least one charge pump and a passive RC network. With preferred embodiments the Hybrid Synchronizer of the present invention might be designed so that most of the second block SBLK is exactly as required by a conventional single-stage PLL, thus making it available as pre-designed blocks Nested Form FIG. 2A illustrates a nested form of the invention. The output of the first block, i.e. the intermediate clock IC, is used as input to the second block. With this nested form of the invention, the intermediate clock IC possibly only comprises an intermediate event clock IEC. The first block has three inputs. The first input is a timing reference TR. This is the signal that the circuit will lock to. The second input is the local clock LC, which is connected to a stable clock SC. The third input is a feedback signal 110 from the divider block 18 of the second block SBLK.

Within the first block FBLK, the first detector FD is preferably a time detector. It outputs a digital or analog signal representing the time offset between the timing reference TR and the feedback signal 110. This detector output 102 is run through the first loop filter FLF and then used as a control signal 103 for the number-controlled oscillator NCO. By processing the stable clock SC, the number-controlled oscillator NCO generates the intermediate event clock IEC with mean relative period according to the control signal 103. The stable clock SC is preferably sourced from a crystal oscillator, either directly or indirectly.

The second block SBLK is preferably a phase-locked loop (PLL). It takes the intermediate event clock IEC as input. This is connected to the second detector SD, which is preferably a phase detector, and which compares the intermediate event clock IEC with a feedback signal 112 from the divider block 18. The detected difference expressed as a control signal is sent through the second loop filter SLF and is then used to control the voltage-controlled oscillator VCO. The output of the VCO is the output event clock OEC, thus controlled via the intermediate event clock IEC. The output event clock OEC might be used as an output, but it is also used as input to the divider block 18, where it is divided to create the output frame sync OFS and the feedback signal 110. The feedback signal 110 communicates the framing of the output clock OC to the first detector FD. It may be a simple copy of the output frame sync OFS.

For applications that do not require phase/time locking, a frequency detector may be used as first detector FD.

An anti-jitter circuit (AJC) e.g. comprising a monostable, integrator, DC removal path and comparator might substitute the second block SBLK in this nested form of the invention. However, unlike PLLs, such circuits are generally not able to perform frequency multiplication.

The nested form of the invention is well-suited to applications in which the stable clock SC is the preferred clock for digital circuitry. This might for example be the case on a silicon integrated circuit that necessarily contains other blocks that are clocked by the stable clock SC.

Cascade Form

FIG. 2B illustrates a cascade form of the invention. In this form the output of the first block, i.e. the intermediate clock IC, preferably comprises two components, being an intermediate event clock IEC and an intermediate frame sync IFS. They are both used as inputs for the second block SBLK. The first block has in this form only two inputs. These are a timing reference TR, which is the signal that the circuit will lock onto, and a local clock LC, connected to a stable clock SC. The cascade-form embodiment has no feedback from the second block SBLK to the first block FBLK. The signal that the first detector FD will compare to the timing reference signal TR is instead an internal signal 111.

The first block is preferably a time-locked loop (TLL). Hence the first detector FD is preferably a time detector. It outputs a digital or analog signal representing the time offset between the timing reference TR and the feedback signal 111. The detector output 102 is run through the first loop filter FLF and then used as a control signal 103 for the number-controlled oscillator NCO. By processing the stable clock SC, the number-controlled oscillator NCO generates the intermediate event clock IEC with mean relative period according to the control signal 103. The number-controlled oscillator NCO also has an auxiliary output, the intermediate frame sync IFS. The stable clock SC is preferably sourced from a crystal oscillator, either directly or indirectly.

The internal signal 111 may be a feedback signal from the number-controlled oscillator. Alternatively, it may be a copy or derivative of the local clock LC, and hence of the stable clock SC, as will be explained later.

Figure 9:
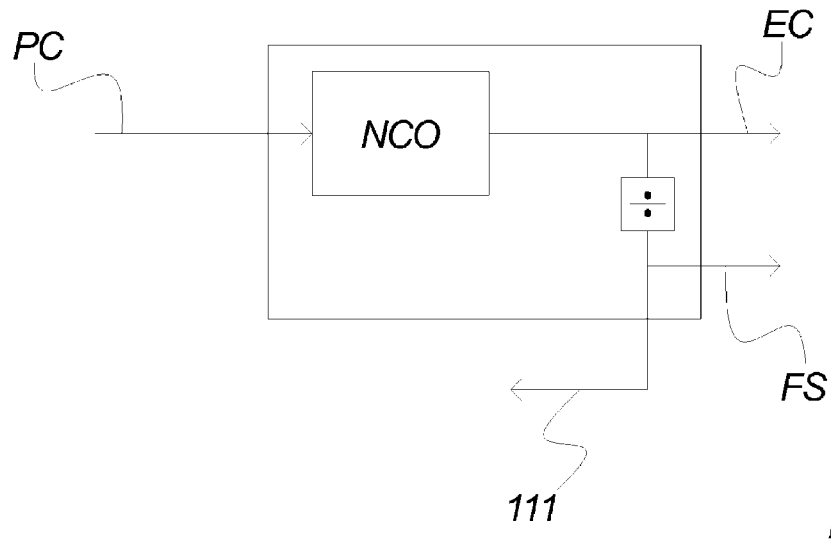
FIG. 9 shows an embodiment where the number-controlled oscillator is equipped with an auxiliary output for feedback.

The cascade-form Hybrid Synchronizer of FIG. 2B incorporates a number-controlled oscillator that has auxiliary outputs. A straightforward example of such a number-controlled oscillator is shown in FIG. 9. A more sophisticated example is given later in FIG. 13.

The second block SBLK is preferably a phase-locked loop. It takes the intermediate event clock IEC and the intermediate frame sync IFS as inputs to the second detector SD, which is a combined clock-and-frame phase detector as explained later with reference to FIG. 16. The second detector SD also takes two feedback signals from the divider block 18. The first is a feedback event clock 112 from the output event clock OEC, optionally divided before it is fed back, and the second is a feedback frame sync 113 from the output frame sync OFS. The second detector SD compares the intermediate event clock IEC with the feedback event clock 112, and the intermediate frame sync IFS with the feedback frame sync 113. It outputs a control signal, which is sent through the second loop filter SLF and is then used to control the voltage-controlled oscillator VCO. The output of the VCO is the output event clock OEC, thus controlled via the intermediate event clock IEC and the intermediate frame sync IFS. The output event clock OEC is divided within the divider block 18 to form the output frame sync OFS, and the feedback signals 112 113.

For applications that do not require phase/time locking, a preferred embodiment omits the intermediate frame sync IFS and the feedback frame sync 113, and uses a conventional second phase detector SD. Additionally, this preferred embodiment breaks the loop in the first block by taking the internal signal 111 from the local clock LC. For first detector FD it uses a frequency detector, e.g. a simple period-measuring counter. The first low-pass filter FLF may usefully have a DC gain of exactly unity.

An anti-jitter circuit (AJC) might substitute the second block SBLK of this cascade form of the invention in implementations that do not perform phase or time locking.

Like the nested form, the cascade form of the invention is well-suited to applications in which the stable clock SC is the preferred clock for digital circuitry. Additionally, it removes the dependence of the first block FBLK on the second block SBLK, which eases implementation and testing, and increases flexibility in use. Also, it is particularly appealing for reference-locked frequency synthesis.

Coupled Form

FIG. 2C illustrates a coupled form of the invention. The output of the first block, i.e. the intermediate clock IC, is used as input for the second block SBLK. With this coupled form of the invention, the intermediate clock IC possibly only comprises an intermediate event clock IEC. The first block has three inputs. The first input is a timing reference TR. The second input is a feedback signal 110 from the divider block 18 of the second block SBLK. The third input is the local clock LC, which in this form is from the output event clock OEC of the second block SBLK.

Within the first block FBLK, the first detector FD is preferably a time detector. It outputs a digital or analog signal representing the time offset between the timing reference TR and the feedback signal 110. This detector output 102 is run through the first loop filter FLF and then used as a control signal 103 for the number-controlled oscillator NCO. By processing the output event clock OEC, the number-controlled oscillator NCO generates the intermediate event clock IEC with mean relative period according to the control signal 103.

The second block takes the intermediate event clock IEC as input. This is connected to the second detector SD, which is preferably a phase detector, and which compares the intermediate event clock IEC with the stable clock SC. This results in a control signal, which is sent through the second loop filter SLF and then used to control the voltage-controlled oscillator VCO. The output of the VCO is the output event clock OEC, thus controlled via the intermediate event clock IEC. The output event clock OEC is used as feedback 114 to the first block FBLK, and also as input to the divider block 18, where it is divided to create the output frame sync OFS and the feedback signal 110. The feedback signal 110 communicates the framing of the output clock OC to the first detector FD. It may be a simple copy of the output frame sync OFS. The stable clock SC is preferably sourced from a crystal oscillator, either directly or indirectly.

For applications that do not require phase/time locking, a frequency detector may be used as first detector FD.

With the coupled-form embodiment, the second block SBLK cannot be substituted with an anti-jitter circuit, as explained above for the nested-form embodiment.

The coupled form of the invention is well-suited to applications in which the output event clock OEC is the preferred clock for digital circuitry. This might for example be the case on a silicon integrated circuit that has a dedicated function closely associated with the voltage-controlled oscillator VCO. Also, the coupled form is well-suited to applications requiring the lowest intrinsic jitter, because it allows higher phase comparison rates at the second detector SD and lower justification jitter in the number-controlled oscillator NCO.

Time-Locked Loop

Figure 3A:
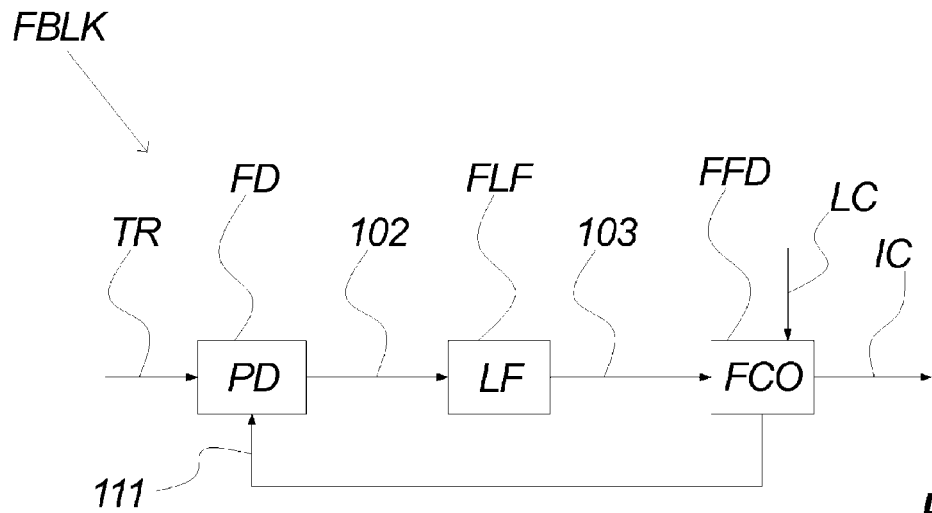
FIG. 3A-3C illustrate in principle different embodiments of the first block.
Figure 3B:
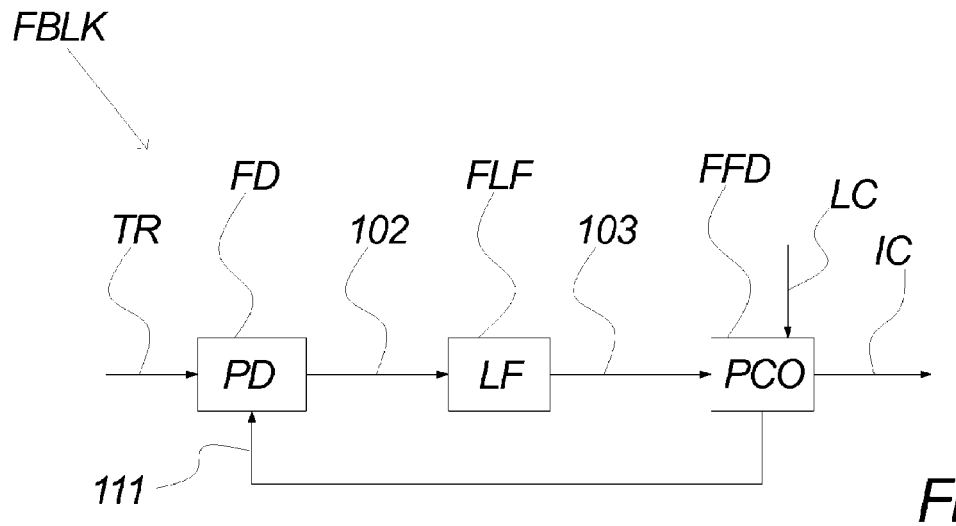
Figure 3C:
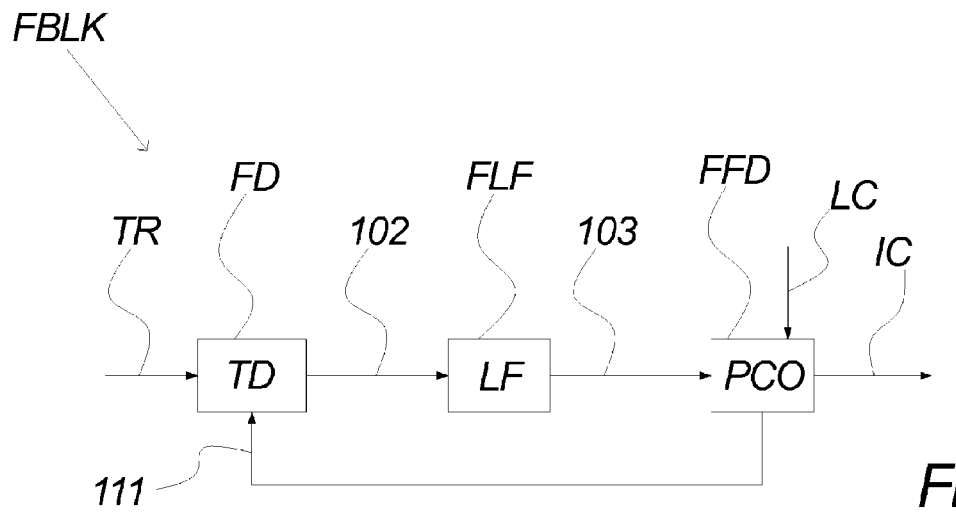
Figure 13:
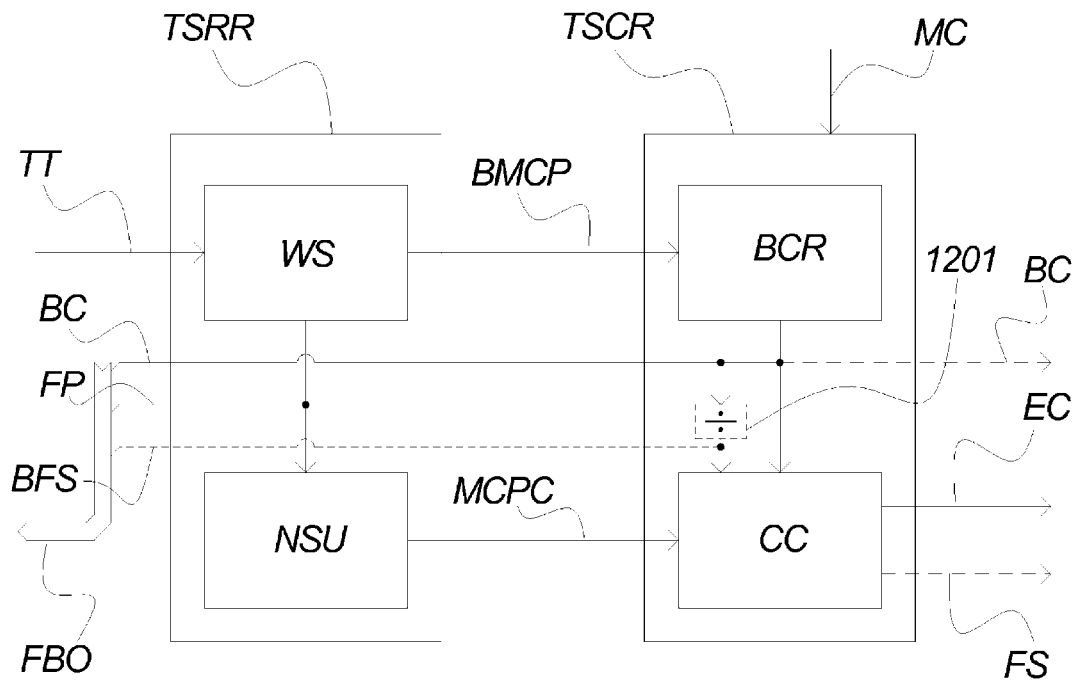
FIG. 13 illustrates an embodiment where the High-Performance NCO is equipped with an auxiliary output for feedback.

FIGS. 3A-3C illustrate different combinations of the building blocks in the first block FBLK of FIG. 2B. They do however apply equally to the first blocks FBLK of FIGS. 2A and 2C and to other numeric loops. They all comprise a number-controlled oscillator NCO, a detector FD and a loop filter FLF, connected in a loop as described above in relation to FIG. 2B. Feedback around the loop causes the number-controlled oscillator NCO, and hence the intermediate clock IC, to lock to the timing reference TR. The feedback signal 111 is taken from an auxiliary output of the NCO. This auxiliary output is derived from the NCO's main output e.g. as illustrated in FIG. 9 or FIG. 13.

In FIG. 3A, the building blocks are the standard ones for a phase-locked loop (PLL). The detector is a phase detector PD, meaning that it expresses the asynchrony of its inputs as a phase angle. For e.g. a 45-degree phase difference between clock inputs, its output 102 takes some value that is more-or-less independent of the frequency of those clocks. The oscillator in FIG. 3A is a frequency-controlled oscillator FCO, meaning that its frequency scales more-or-less linearly with the value of its control input 103. This combination of building blocks yields loop dynamics (damping factor, stability margin etc.) that are more-or-less independent of the frequency of the timing reference TR.

High-performance number-controlled oscillators are largely or exclusively of the period-controlled type, meaning that it is their period rather than their frequency that scales linearly with the value of their control input. In a PLL context, their gain is a function of their current frequency. FIG. 3B shows a loop that is identical to the phase-locked loop of FIG. 3A, except that its oscillator is a period-controlled oscillator PCO. The dynamics of such a loop will vary across its frequency range. This can be a significant problem in loops that must operate over a wide frequency range. Prior-art attempts to solve this problem include adding a nonlinear stage before the oscillator to effectively turn it back into a frequency-controlled oscillator.

With preferred embodiments of the Hybrid Synchronizer of the present invention, consistent loop dynamics are achieved over a wide frequency range and despite the use of a period-controlled NCO by a) implementing the first loop filter FLF as a sampled-signal filter and operating it at a rate that scales with the frequency of the oscillator or the reference, and b) using a first detector FD that expresses the asynchrony of its inputs as a time interval rather than a phase angle. For e.g. a 45-degree phase difference between clock inputs to such detectors, their outputs scale with the period of those clocks. Such detectors may be called time detectors.

FIG. 3C shows a loop in which the detector is a time detector TD, the oscillator is a period-controlled oscillator PCO, and the response of the loop filter LF frequency-scales with the loop output IC or the loop input TR. Such loops may be called time-locked loops (TLL). A feature of time-locked loops is that their closed-loop bandwidth scales with their frequency of operation.

Mode of Operation

In the following is described the mode of operation of the Hybrid Synchronizer of the present invention. The first block FBLK locks to and typically multiplies the timing reference TR, and attenuates mid- and high-frequency jitter. By choosing a low corner frequency for the first block, e.g. 10 Hz, most of the phase noise on the timing reference TR is filtered away. The first block typically comprises a time-locked loop, which may be referred to as the numeric loop. Its bandwidth is set largely by the first loop filter FLF. By not using an expensive and inflexible voltage-controlled crystal oscillator (VCXO) or similar, the number-controlled oscillator NCO however injects its own significant amount of phase noise, i.e. jitter. The dominant mechanism for this is typically the process of justifying (i.e. aligning) the edges of the generated clock IC to edges or interpolated phases of the master clock LC. For this reason the NCO jitter is referred to as justification jitter. The justification jitter is known to the designer, and is at least partly controllable. One method of controlling it is to perform some kind of jitter spectrum shaping and/or smoothing within the NCO, as is done in the High-Performance NCO of the present invention (described afterwards).

The second block SBLK locks to and optionally multiplies the intermediate clock IC, and attenuates high-frequency jitter. As the NCO preferably uses a jitter spectrum shaping where the justification jitter is biased towards high frequencies, a relatively high corner frequency can be chosen for the second block, e.g. 100 kHz. The second block typically comprises a phase-locked loop, which may be referred to as the analog loop. Its bandwidth is set largely by the second loop filter SLF. The second block SBLK preferably uses a voltage-controlled oscillator VCO such as a ring oscillator, which is cheap, has a wide frequency range and is integrable on chip. This also permits the use of conventional and pre-designed building blocks for the second block. Unfortunately this kind of oscillator also adds a further amount of jitter to the signal. This VCO intrinsic jitter is however easily attenuated by feeding back the signal. Using the second loop filter SLF to remove both the justification jitter and the VCO jitter necessitates a compromise for the characteristics of this filter. To filter away the justification jitter, a narrow low-pass filter does best, but to filter away the VCO jitter a wide filter does best, as it is positioned in the feedback path of the VCO. In fact a hard feedback with a closed-loop gain of 1 is the best method to target the VCO jitter. Also the wanted bandwidth of the Hybrid Synchronizer of the present invention influences on the selection of the corner frequency of the second loop filter SLF.

The Hybrid Synchronizer of the present invention behaves differently to jitter injected at various points in the circuit, and in various frequency bands. The four most significant jitter sources are the timing reference TR, the number-controlled oscillator NCO, the stable clock SC and the voltage-controlled oscillator VCO. The two most significant parameters affecting jitter attenuation are the bandwidth of the numeric loop and the bandwidth of the analog loop. With a numeric-loop bandwidth of e.g. 10 Hz and an analog-loop bandwidth of e.g. 100 kHz, three distinct frequency bands exist.

In the lowest band, e.g. below 10 Hz, the Hybrid Synchronizer tracks its timing reference TR and the justification jitter. However, the justification jitter can be made insignificant in this band by exercising appropriate control of its spectrum within the NCO. Jitter from the stable clock SC is attenuated by the action of feedback around the numeric loop. VCO jitter is heavily attenuated by the action of feedback around the analog loop. Consequently low-frequency jitter on the timing reference TR can be the most significant jitter let through to the output OC.

In the middle band, e.g. 10 Hz to 100 kHz, the justification jitter and any jitter on the stable clock SC both pass to the output OC without attenuation. It is for this reason that the stable clock SC is preferably sourced from a crystal oscillator. Jitter from the timing reference TR is attenuated by the first loop filter FLF, and VCO jitter is attenuated by feedback around the analog loop.

In the highest band, e.g. above 100 kHz, it is the VCO jitter that passes straight to the output OC. However, the negative slope of the VCO jitter spectrum does help to moderate its contribution in this band. Jitter from the timing reference TR is heavily attenuated by the first loop filter FLF. The justification jitter and any jitter on the stable clock SC are both attenuated by the second loop filter SLF.

Note that the Hybrid Synchronizer has the prospect of lower close-in phase noise and lower vibration sensitivity than VCXO-based PLLs. There are two reasons for this. The first is that the crystal oscillator that generates the stable clock SC can be a free-running one. The second is that it can use a crystal that has been cut for high Q rather than frequency accuracy over a range of temperatures.

Jitter Spectra

FIGS. 4A-4E show results achieved by simulating the Hybrid Synchronizer of the present invention under different conditions. All of these figures are graphs depicted in the same double logarithmic coordinate system, with frequency measured in Hertz on the x-axis and jitter on the y-axis. Each of these figures comprises five curves: the spectral density of the Hybrid Synchronizer's intrinsic output jitter OJ, the spectral density of the justification jitter JJ, the spectral density of the filtered justification jitter FJJ, the spectral density of the VCO jitter VJ and the spectral density of the filtered VCO jitter FVJ.

The intrinsic output jitter OJ is measured at the output of the Hybrid Synchronizer of the present invention, the justification jitter JJ is measured across the number-controlled oscillator NCO with its control input held static, and the VCO jitter VJ is measured at the output of the voltage-controlled oscillator VCO with its control input held static. The filtered justification jitter FJJ is that part of the output jitter OJ originating from the justification jitter JJ, and the filtered VCO jitter FVJ is that part of the output jitter originating from the VCO jitter VJ.

All simulations have been done with a cascade-form embodiment of the invention, as shown in FIG. 2B. The only differences between the simulations are the order of noise shaping carried out within the number-controlled oscillator NCO, and the corner frequency of the analog loop.

Figure 4A:
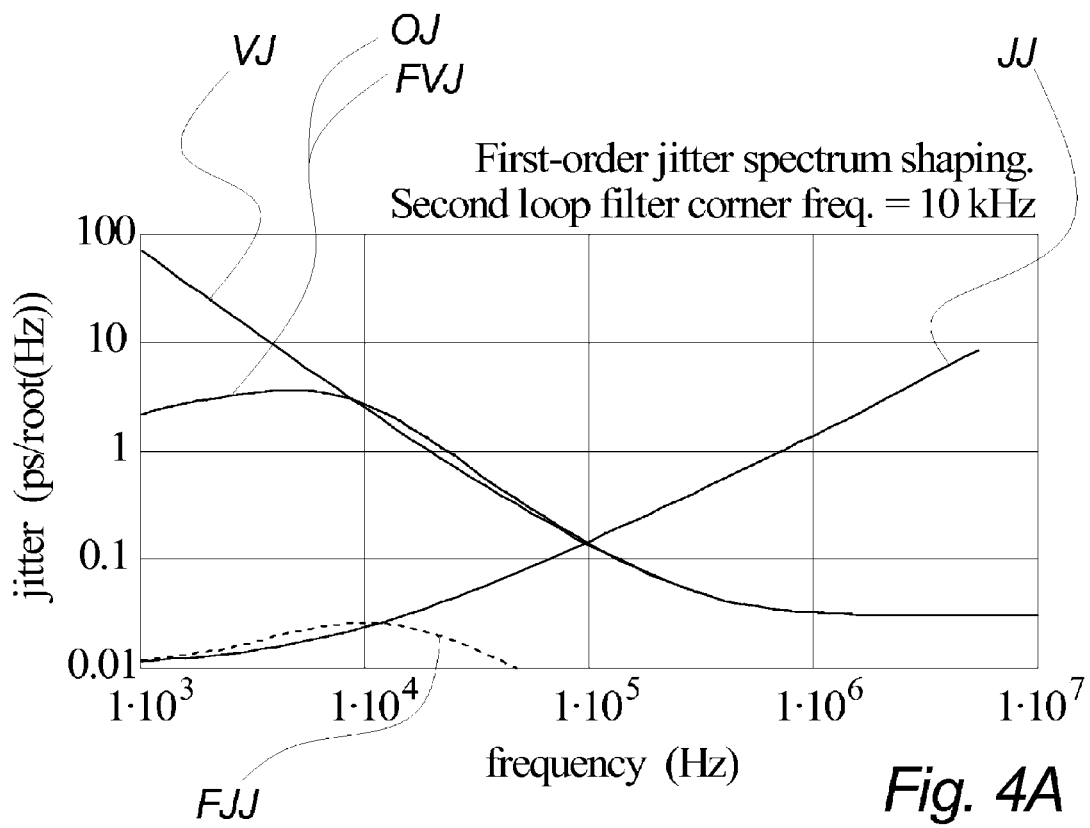
FIG. 4A-4E show jitter spectra from the Hybrid Synchronizer when different levels of noise shaping and different analog-loop corner frequencies are used.
Figure 4B:
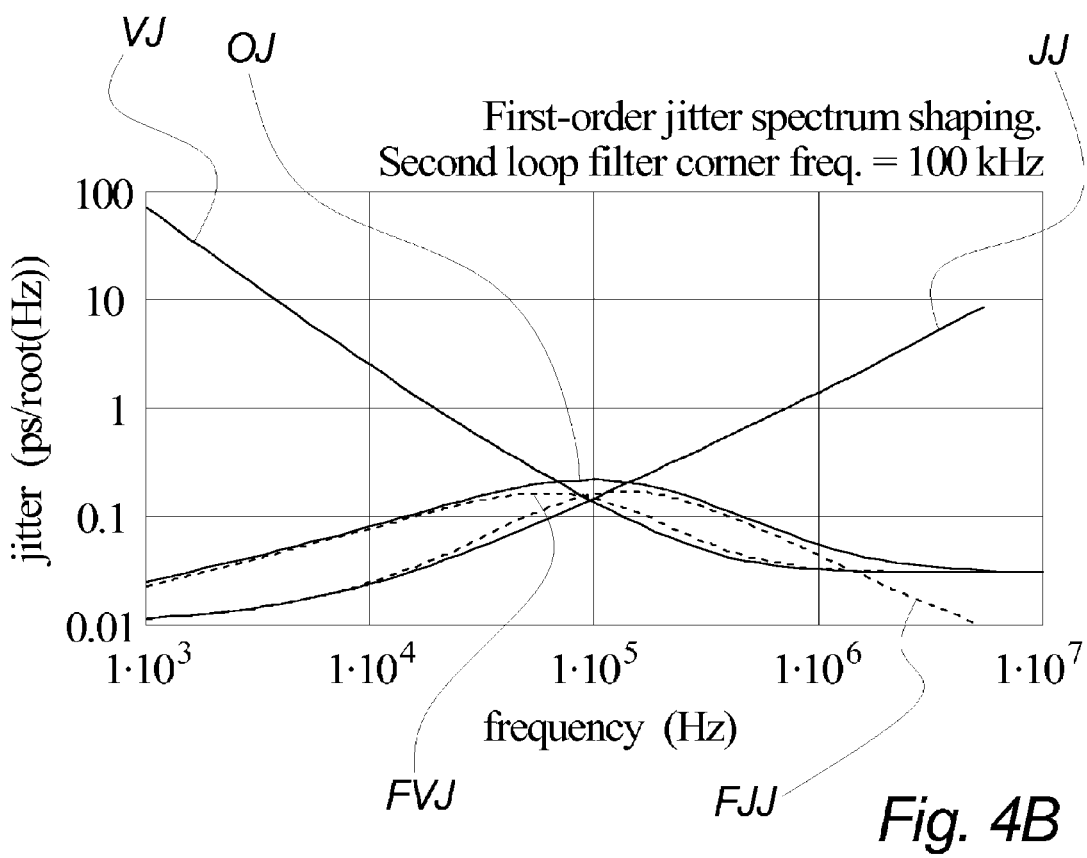

FIGS. 4A and 4B are the results of performing first-order noise shaping, with corner frequencies of 10 kHz and 100 kHz. The justification jitter JJ is the same for both simulations, as it is only affected by the order of noise shaping. It is easy to see the effect of noise shaping, as the justification jitter is much greater at higher frequencies. The VCO jitter is also the same for both simulations, as it is not affected by any of the variable parameters in this simulation. As seen, the VCO jitter is worse for low frequencies.

The filtered justification jitter FJJ is the result of sending the justification jitter JJ through the second block SBLK comprising a loop filter SLF with effective low-pass corner frequency of 10 kHz or 100 kHz respectively. Because of the positive slope of the justification jitter spectrum JJ, the peak density of the filtered justification jitter FJJ increases with the effective corner frequency of the loop filter SLF.

The filtered VCO jitter shows the result of the feedback loop 112 and the second loop filter SLF. Because of the negative slope of the VCO jitter spectrum, the peak density of the filtered VCO jitter FVJ decreases when the effective corner frequency of the second loop filter SLF is increased. As this behaviour is the opposite of the behaviour of the filtered justification jitter, this suggests that a balance between the filtering of the justification jitter and the filtering of the VCO jitter has to be found.

As seen from the output jitter graph OJ, the best result of the two simulations with first-order noise shaping is FIG. 4B, where the corner frequency of the analog loop is 100 kHz.

Figure 4C:
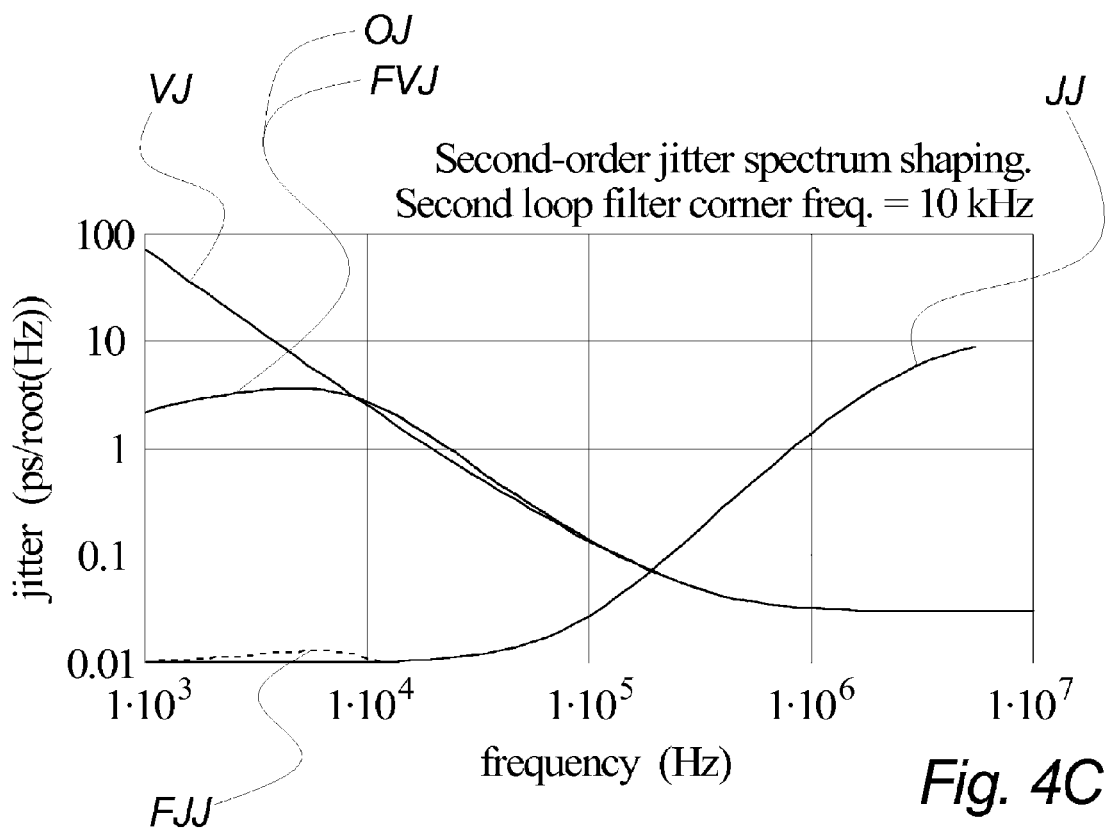
Figure 4D:
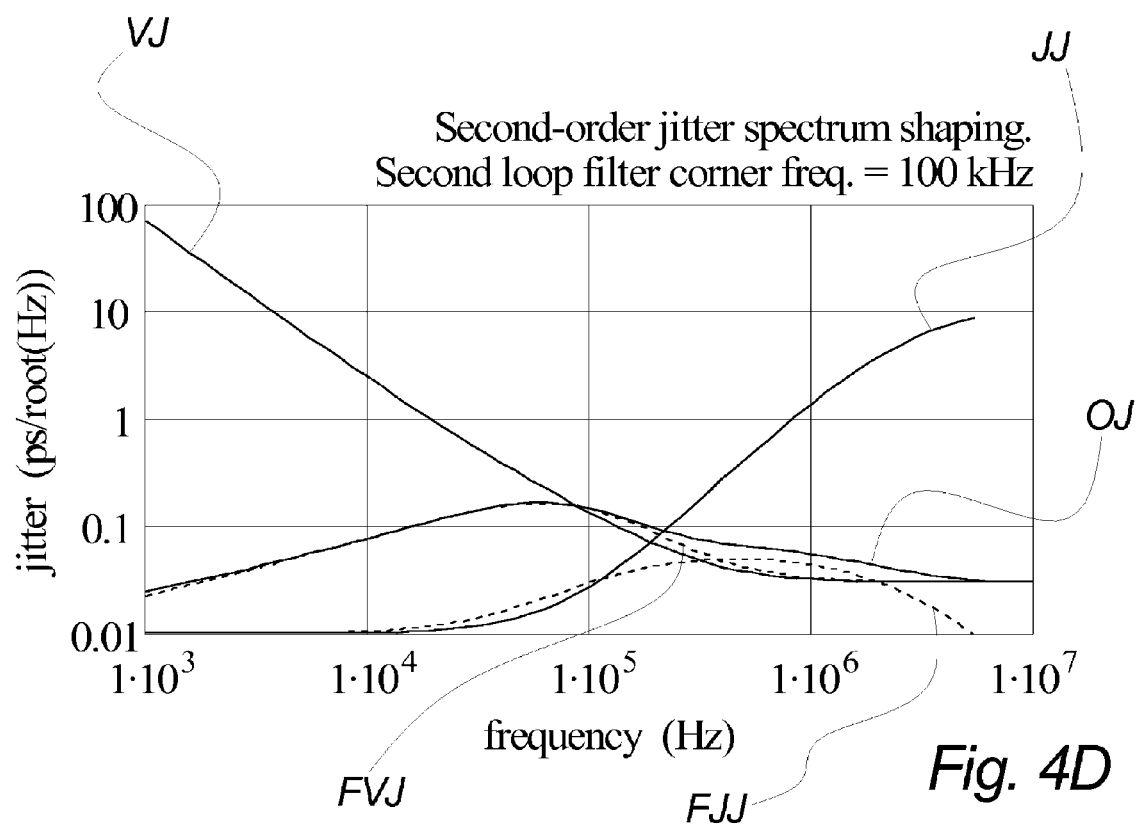
Figure 4E:
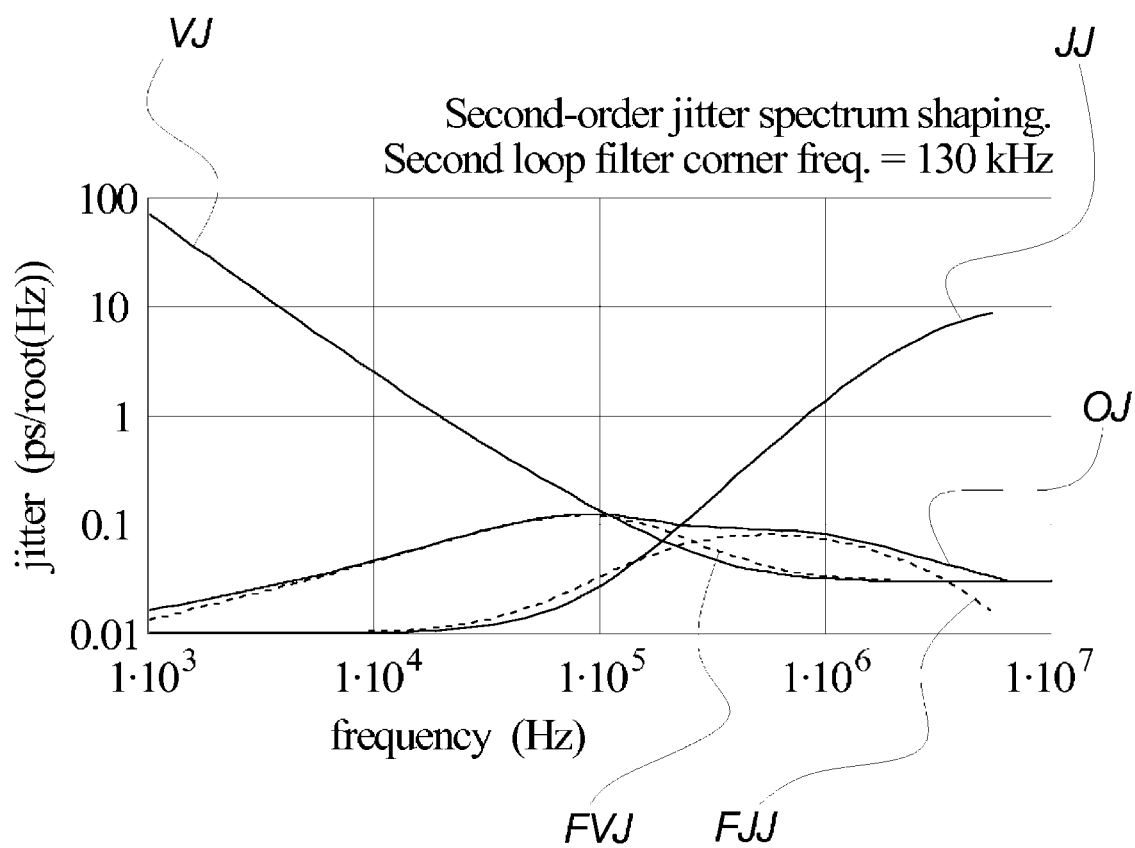

In FIGS. 4C, 4D and 4E the same simulations are performed, but now second-order noise shaping is carried out in the number-controlled oscillator NCO. The corner frequency of the second loop filter SLF is 10 kHz, 100 kHz and 130 kHz in these three simulations. The justification jitter JJ is the same for all three simulations, but compared to the 4A and 4B simulations, the effect of second-order noise shaping instead of first-order shaping is obvious. The second-order noise-shaped justification jitter JJ is more effectively pushed towards high frequencies, and the slope is steeper.

As a consequence of the better-shaped justification jitter JJ, the filtered justification jitter FJJ in simulations 4C and 4D is smaller than in the corresponding simulations 4A and 4B.

The VCO jitter VJ is still the same as in FIGS. 4A and 4B, as it is not affected by the variable parameters. Therefore also the filtered VCO jitter FVJ is the same, in the simulations with the same corner frequency.

As the intrinsic output jitter OJ is mostly the sum of the filtered justification jitter FJJ and the filtered VCO jitter FVJ, the output jitter OJ gets smaller with the second-order noise shaping of simulations 4C and 4D than with the simulations 4A and 4B, though the difference for the simulations with an analog loop corner frequency of 10 kHz is negligible.

Regarding the order of noise shaping performed by the number-controlled oscillator NCO, it can be concluded that higher order is better, at least up to the point where the order matches that of the closed-loop response roll-off of the analog loop. The disadvantage of this is of course a more expensive circuit. With regards to the choice of a corner frequency for the analog loop, the conclusion is that a compromise must be made. Lower corner frequencies give more attenuation of the justification jitter JJ but less attenuation of the VCO jitter VJ. Conversely, higher corner frequencies give more attenuation of the VCO jitter VJ but less attenuation of the justification jitter JJ. A qualified pick of corner frequency, is a frequency close to where the VCO jitter graph VJ intersects with the justification jitter graph JJ.

Simulation 4E shows the result of such a qualified compromise with regards to choosing a corner frequency for the analog loop. The corner frequency is set to 130 kHz, and the number-controlled oscillator NCO provides second-order noise shaping.

The spectral density of the output jitter OJ is the best compared to the other simulations 4A-4D, as seen from a signal-to-noise-ratio point of view. The output jitter OJ peak density in simulation 4E is approximately thirty times smaller than the output jitter OJ peak density of the simulations 4A and 4C where the corner frequency is 10 kHz. At the same time, this peak appears at approx. 100 kHz in simulation 4E, while it appears at approx. 5 kHz in simulations 4A and 4C. The latter is by far the worst regarding e.g. audio and video applications.

Another important aspect, when considering the bandwidth of the analog loop, is the sensitivity of the circuit to interference from supply noise, substrate noise, capacitive and inductive crosstalk, vibration etcetera. Feedback moderates all of these effects, which argues for making the analog loop bandwidth as high as possible, within the other constraints.

Because it divorces the analog loop bandwidth from the reference jitter attenuation, the Hybrid Synchronizer enables robust designs with large amounts of feedback disciplining the voltage-controlled oscillator.

Prior-Art NCOs

Through the above description of the Hybrid Synchronizer, a number-controlled oscillator NCO has been comprised with the first block FBLK. A number-controlled oscillator is a process or circuit that is clocked by a master clock and generates an event clock. These clocks are typically rectangular waveforms. The edges of the event clock are justified (i.e. aligned) to edges or interpolated phases of the master clock. A numeric control input sets the frequency or period of the event clock, relative to that of the master clock, with arbitrarily high precision. Number-controlled oscillators as outlined above have also been referred to as digitally-controlled oscillators and fractional frequency dividers. Commonly known number-controlled oscillators fall into three categories, which are shown in FIGS. 5A-5C.

Figure 5A:
FIG. 5A-5C illustrate three prior-art number-controlled oscillators.

FIG. 5A shows a phase-accumulating number-controlled oscillator. It comprises an integrator INT, which is clocked by the master clock and accumulates frequency control values. The event clock is established as the most significant bit of the output value of the integrator. The output frequency depends on the specific numeric format used, and may e.g. be calculated as the frequency control value multiplied by the master clock frequency divided by the $N^{th}$ power of 2, where N is the number of bits. Thus the bit-width determines the lowest frequency possible for the event clock as the frequency of the master clock divided by the $N^{th}$ power of 2, while the highest possible frequency of the event clock is the master clock divided by 2. A disadvantage of phase-accumulating NCOs is that the event clocks they generate are impure, containing discrete spectral spurs at beat frequencies.

Figure 5B:
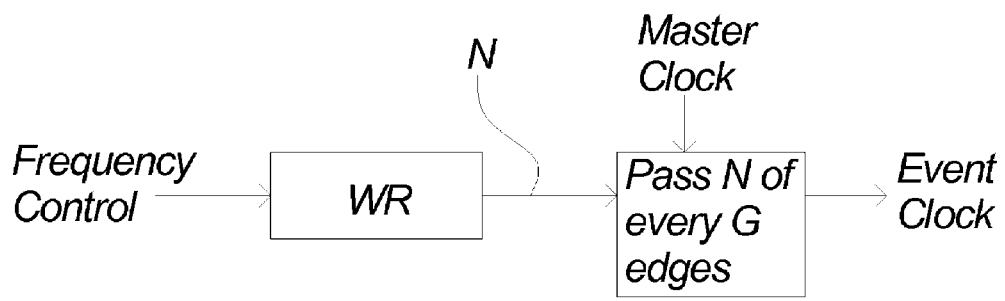

FIG. 5B shows an edge-quota number-controlled oscillator. It comprises a wordlength reducer WR, converting non-integer frequency control values into integers. The output N of the wordlength reducer WR is sent to a block, which for each G master clock periods outputs N event clock periods. The value G is a predefined base number, and defines the lowest frequency possible for the event clock as the frequency of the master clock divided by G. This event clock frequency is achieved by inputting a frequency control value of 1. The highest frequency possible for the event clock is when the frequency control is set to G, thus producing an event clock with the same frequency as the master clock. NCOs of this type can give better results than phase-accumulating NCOs, but still offer only a modest amount of control over the spectrum of the jitter in the generated event clock.

Figure 5C:
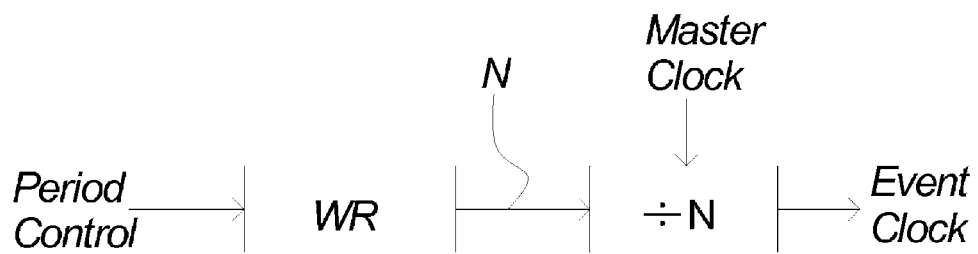

FIG. 5C shows a divider-based number-controlled oscillator. It comprises a wordlength reducer WR, which converts non-integer period control values into integers, and a multi-modulus divider. The wordlength reducer WR is typically a noise shaper, e.g. a delta-sigma modulator. The event clock is established as the master clock divided by the output N of the wordlength reducer WR. The highest possible frequency of the event clock is limited by the peak instantaneous amplitude of the noise from the noise shaper. The lowest possible frequency depends on the resolution of the period control, and has no theoretical limit. Such divider-based NCOs give a large amount of control over the jitter spectrum. This has made them popular in applications such as fractional-N frequency synthesis where clock purity is important. One disadvantage of such NCOs is that the noise introduced by the wordlength reducer WR gets integrated by the divider before it appears as jitter. Hence e.g. a third-order noise shaper is required to achieve second-order jitter shaping. Another disadvantage is that the peak instantaneous jitter is not tightly bounded, again due to the integrating action of the divider.

As seen, several types of number-controlled oscillator are already common in the art, but all of them have shortcomings of one kind or another. A new type of number-controlled oscillator having fewer shortcomings will now be described High-Performance Number-Controlled Oscillation A number-controlled oscillator according to an embodiment of the present invention first derives a stream of master-clock pointers MCP from a period control input PC by a process comprising accumulation/integration and resolution reduction. It then constructs an event clock output EC by selecting those edges or interpolated phases of a provided master clock MC that are pointed to by the master-clock pointers MCP.

Such an oscillator may be referred to as a high-performance number-controlled oscillator, or just as a High-Performance NCO.

A High-Performance NCO according to the present invention is well suited to use as NCO in the Hybrid Synchronizer of the present invention. However, it is emphasized that it is in no way limited to such use, but may also be used in other circuits and applications. Indeed, the High-Performance NCO can provide clocks that are in many applications of sufficient quality to be usable directly, i.e. without any additional jitter filtering. This is particularly so if the master clock MC is a fine-grain multiphase clock.

Figure 6A:
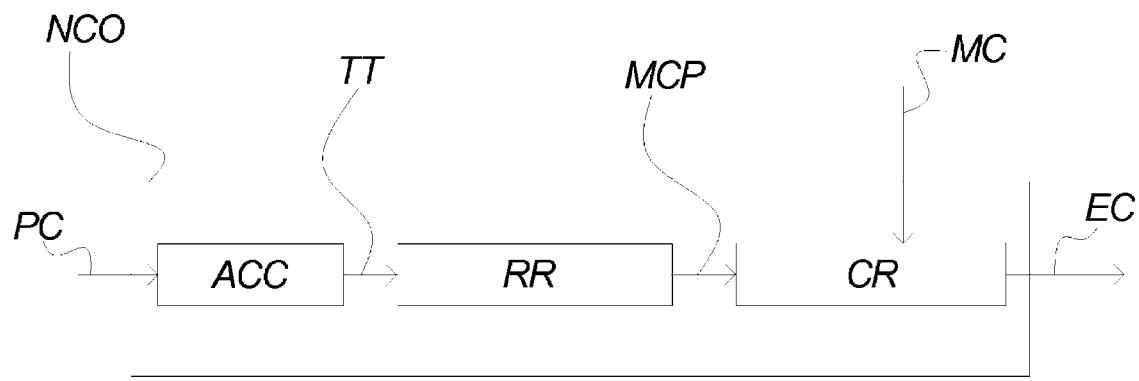
FIG. 6A shows a preferred embodiment of the High-Performance NCO of the present invention.

FIG. 6A shows a preferred embodiment of the High-Performance NCO of the present invention. It comprises an accumulator ACC, a resolution reducer RR and a clock renderer CR, all placed sequentially along the signal path from a period control signal PC to an event clock signal EC. The signal between the accumulator ACC and the resolution reducer RR is a stream of target times TT, and the signal between the resolution reducer RR and the clock renderer CR is the stream of master-clock pointers MCP. In addition to its master-clock pointers input MCP, the clock renderer CR also receives a master clock MC.

As will become apparent, because the resolution reduction is done after the accumulation, the associated quantization error does not get integrated before it appears as jitter. Hence e.g. second-order jitter spectrum shaping requires only a second-order noise shaper.

It is noted in passing that the resolution reducer RR may alternatively be placed before the accumulator, still within the scope of the present invention. That is however not a preferred embodiment, and will not be described in detail.

The master clock MC may e.g. comprise a square clock signal preferably derived from a crystal oscillator, a multiphase clock or other kinds of suitable clock forms. The period control value PC has an integer part and a fractional part, e.g. 2.6. The period control PC denotes the number of master clock MC periods for each ideal output period, though the edges of the real output event clock EC must follow edges of the master clock MC. The output event clock EC is thereby typically a rectangular clock signal with mean frequency equal to the frequency of the master clock MC divided by the value given as period control PC.

The accumulator ACC is triggered by the event clock EC. This means that the accumulator ACC performs an accumulation at each event clock EC period. Thereby the target times TT indicate the times, expressed with respect to a rising count of master clock MC edges, that an ideal output clock event should occur. The capacity of the accumulator ACC is preferably more than twice the maximum value of the period control signal PC, thus making it possible to add numbers each with the value of the period control signal PC. As the accumulator ACC naturally not has infinite resolution, its output target times TT will have a maximum value, e.g. 8.0, after reaching which they automatically wrap around, starting from 0.0 again. The accumulator ACC may be considered equivalent to an integrator.

A main purpose of the resolution reducer RR is to reduce the resolution, by e.g. truncation or rounding, of the non-integer valued target times TT to integer valued master-clock pointers MCP. Many different embodiments of the resolution reducer RR are possible. Preferred embodiments may include using dithered quantization and/or error feedback to smooth or shape the quantization error, and hence the jitter, produced with a simple truncation. The resolution of the master-clock pointers MCP is not necessarily as big as the resolution of the target times TT, as the master-clock pointers MCP will always have integer values. By converting a non-integer valued target time to an integer valued master-clock pointer a pointer to a specific edge of the master clock MC is established.

The clock renderer CR produces an output event clock EC according to its inputs, i.e. the stream of master-clock pointers MCP and the master clock MC, by letting each master-clock pointer address its corresponding master clock MC edge or interpolated phase. Embodiments of the clock renderer CR may e.g. do this by means of counters, comparators, multiplexers or other suitable components.

Additional stages such as filters, auxiliary quantizers and saturation limiters can be inserted at various places in the embodiment of FIG. 6A without affecting the basic operation or novelty of the circuit.

Many forms are possible for the event clock EC. At its most basic, it may be a single-wire waveform to be used directly as a clock input to following blocks. It may also be encoded or modulated to make it suited for a specific kind of transmission, or to add further information to it. It may also be used together with the master clock MC, to qualify specific edges of that clock, e.g. as a clock enable input. Also multi-wire forms are possible, e.g. as a multiphase clock. Furthermore each event in the event clock EC may comprise multiple sub-events, such as pulse bursts instead of a single pulse, or encoded information.

Signal Progression

Figure 6B:
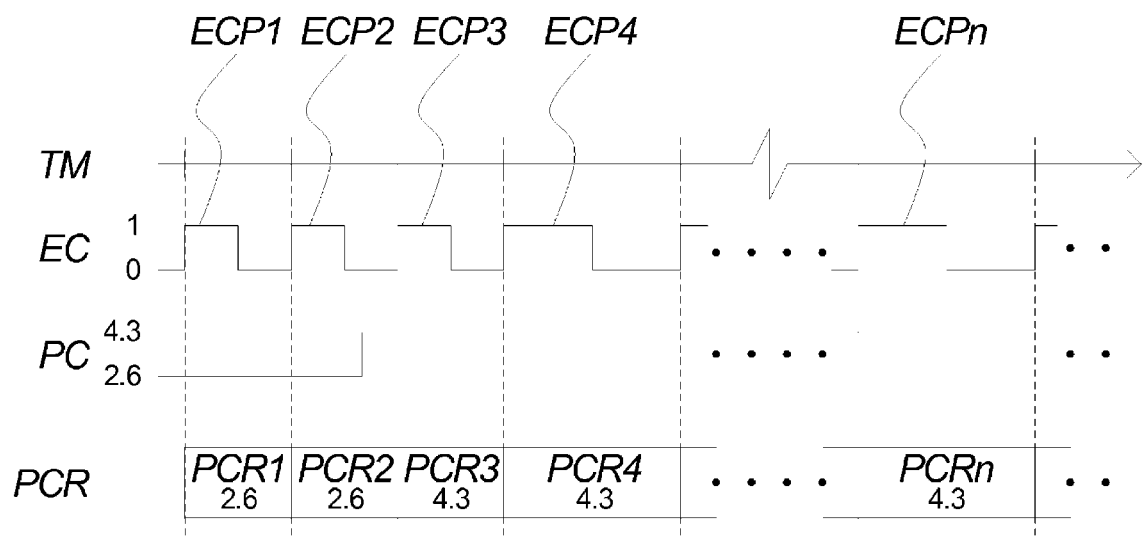
FIG. 6B shows how the period control signal PC is logically divided into period control representations PCR.

Due to reasons of explanation, a FIG. 6B is provided, showing how the period control signal PC logically may be divided into period control representations PCR. The period control signal PC, as used in FIG. 6A above, may be analog or digital, continuous or discrete, and it may change at arbitrary times. It may thus be promoting for the understanding of the accumulator's operation, to logically divide the period control signal PC into exact time-delimited numbers. FIG. 6B comprises a timing diagram, showing a time axis TM, and the event clock EC. The event clock EC is included, as the accumulator ACC is clocked by it. This means that the accumulator ACC performs one accumulation per event clock period ECP1 . . . ECPn. Further the diagram shows an exemplary progress of the period control signal PC. At first it has the value 2.6, but within the second event clock period ECP2, it changes to the value 4.3. The last row shows what values are actually used by the accumulator ACC at different times. These virtual values are referred to as period control representations PCR, and they have a time extent of one event clock period ECP1 . . . ECPn. The first period control representation PCR1 has the value 2.6. So does the next period control representation PCR2, as the period control signal PC still has the value 2.6 at the beginning of the second event clock period ECP2. But as the period control PC value has changed before the third event clock period ECP3, the third period control representation PCR3 gets the value 4.3. This results in the subsequent event clock periods ECP4 . . . ECPn being longer, and thus also stretching the duration of the subsequent period control representations PCR4 . . . PCRn.

FIG. 7 shows how the different signals develop with time, and how the jitter follows the quantization error. The upper signal is the master clock MC. It is a constantly running clock with a constant frequency. In FIG. 7 there is a vertical dashed guideline for each master clock MC period.

The second signal of FIG. 7 is the period control PC. This signal is either a digital or analog representation of a value having integer and fractional parts. In the example of FIG. 7 its value is 2.6 from the beginning, and later changing to 4.3.

The third signal represents the target times TT. This is the output from the accumulator ACC, and the input to the resolution reducer RR. The target-times signal TT is either a digital or analog representation of values having integer and fractional parts. As seen from FIG. 7, the target-times signal TT is a running sum of period control values. In the example of FIG. 7, the target-times signal TT is expressed modulo 8, but its boundaries can be anything.

The count 701 is simply a count of master clock MC periods modulo 8.

The target-times signal TT indicates the times expressed relative to the master clock count 701 at which ideal clocks 702 would occur. For example, the first target time is 0.0, and the first ideal clock is at count 0.0. Then the value of the period control signal PC is accumulated with the first target time, resulting in a second target time of 2.6, again meaning that the second ideal clock would occur at count 2.6. The next two target-time values of 5.2 (2.6+2.6) and 7.8 (5.2+2.6), also follow the ideal clock 702. When the addition within the accumulator ACC equals or exceeds 8.0, a value of 8.0 is subtracted from the value. This way the fifth target-time value of 2.4 is achieved by adding 2.6 to 7.8, resulting in 10.4, and then subtracting 8.0.

The fourth signal is the master-clock pointer signal MCP. This is the output of the resolution reducer RR, and the input to the clock renderer CR. The master-clock pointer signal MCP is a digital or analog representation of an integer. The integer represented by the master-clock pointer signal MCP is the value of the target-times signal TT resolution-reduced by means of e.g. dithered quantization, noise shaping or any other method of converting a non-integer stream to an integer stream. The master-clock pointer signal MCP of FIG. 7 shows how the result of such a resolution conversion might look. The master-clock pointer signal MCP is used as control value in the clock renderer CR.

The sixth signal of FIG. 7 is an event clock EC, the output of the High-Performance NCO of the present invention. This is the result of combining the master clock MC with the master-clock pointer signal MCP. The event clock EC pulses occur at the master clock counts 701 indicated by the master-clock pointer signal MCP. For example the first master-clock pointer MCP is zero, and the first event clock EC occurs at a count of 0. Then the accumulator ACC triggered by the event clock EC performs its first addition, resulting in a target-times value of 2.6, again resulting in a master-clock pointer value of 3. This indicates to the clock renderer CR, that the next event clock EC should occur at a count of 3.

The last row at FIG. 7 is the justification jitter JJ. It is simply an indication of the time difference, on a pulse by pulse basis, between the ideal clock 702 and the event clock EC. This time difference is the phenomenon called jitter. As seen from FIG. 7 the jitter exactly equals the quantization error. Quantization error refers to the difference, ignoring delay, between the resolution reducer's input signal and its output signal.

The following sections describe embodiments of the different blocks of the High-Performance NCO of the present invention in further detail.

Resolution Reduction

Figure 8A:
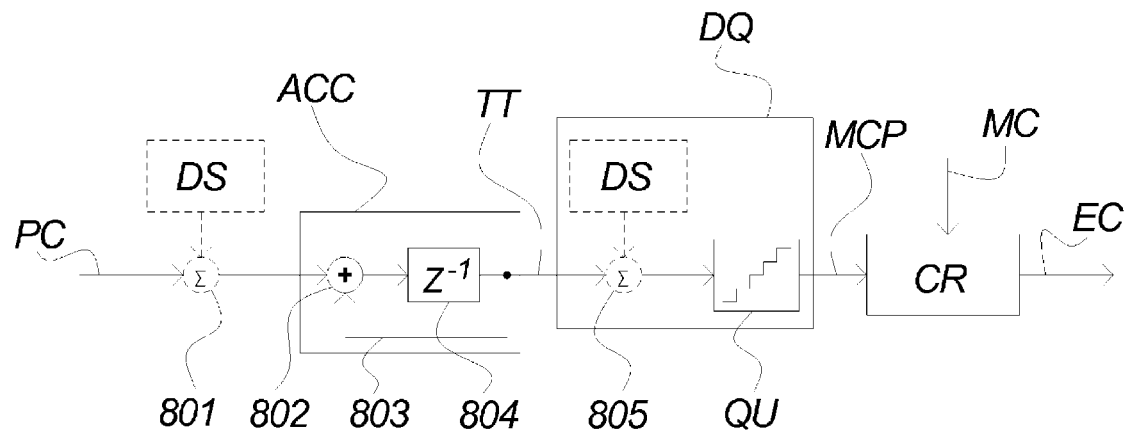
FIG. 8A illustrates how a dithered quantizer can be used as a resolution reducer.

FIG. 8A illustrates an embodiment of the accumulator ACC and resolution reducer RR using a dithered quantizer to control the spectrum of the jitter. It comprises the input period control PC, which as said is a digital or analog representation of a number comprising both an integer part and a fractional part. This period control signal PC is possibly sent to a summing point 801, where it is added to a dither signal originating from a dither source DS, before it is sent to the accumulator ACC.

The accumulator ACC comprises a summing point 802, a delay block 804 and a feedback path 803. The delay block 804 is triggered by the event clock EC or similar, making the accumulator ACC perform one addition per event clock EC. All signal paths within the accumulator ACC have at least the same data resolution as the period control signal PC, ensuring that the target-times signal TT is a digital or analog representation of a number with that resolution or better.

Next the target-times signal TT is sent into a dithered quantizer DQ, acting as the resolution reducer RR of FIG. 6A. This comprises a quantizing block QU and optionally also a summing point 805 at which a dither signal derived from a dither source DS is added to the signal before it is quantized. The output from the dithered quantizer DQ is a digital or analog representation of an integer-valued stream of master-clock pointers MCP.

The dither sources DS are pseudo-random number generators or any other appropriate sources, and they may comprise filters to shape the dither signals. The dashed lines of the dithering blocks indicate that the dither signals may be injected at various points in the data path including prior to the High-Performance NCO.

The quantized signal, master-clock pointers MCP, is at last sent to the clock renderer CR together with the master clock MC. The clock renderer CR produces an event clock signal EC from the two signals MCP and MC. Because of the added dither signal(s) the quantizing error, and thereby the justification jitter, is randomized, making its spectrum smooth and typically white.

Figure 8B:
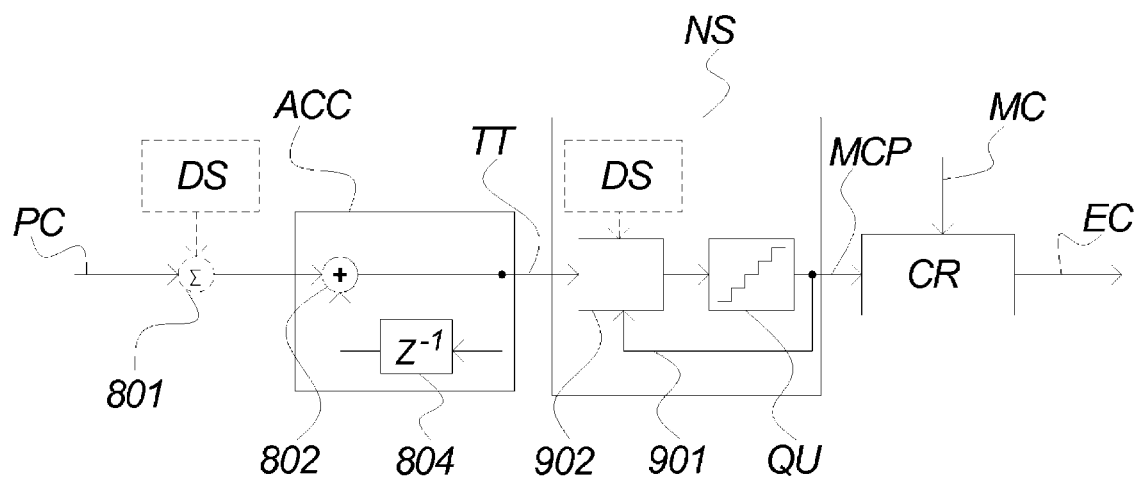
FIG. 8B illustrates how a noise shaping circuit can be used as a resolution reducer.

FIG. 8B illustrates a preferred embodiment of the accumulator ACC and resolution reducer RR, with a noise shaping circuit used as resolution reducer RR. It comprises the period control input PC, which as said is a digital or analog representation of a number comprising both an integer part and a fractional part. This period control signal PC is possibly sent to a summing point 801, where it is added to a dither signal originating from a dither source DS, before it is sent to the accumulator ACC.

The accumulator ACC comprises a summing point 802, and a delay block 804 positioned in a feedback path. The delay block 804 is triggered by the event clock EC or similar, making the accumulator ACC perform one addition per event clock EC. All signal paths within the accumulator ACC have at least the same data resolution as the period control signal PC, ensuring that the target-times signal TT is a digital or analog representation of a number with that resolution or better.

Next the target times signal TT is sent into a noise shaper NS, acting as the resolution reducer RR of FIG. 6A. The noise shaper NS comprises a quantizing block QU, a noise shaping component 902 and optionally also a dither source DS. The output of the quantizing block QU is fed back to the noise shaper component 902. The output from noise shaper NS is a digital or analog representation of an integer-valued stream of master-clock pointers MCP.

The illustrated noise shaping structure 902 represents a conventional noise shaping structure, which may e.g. be a delta-sigma modulator or any other kind of noise shaping circuit. A preferred noise shaping structure 902 has a signal transfer function of unity, but noise shaping circuits with other signal transfer functions are applicable and within the scope of this invention.

The dither sources DS are pseudo-random number generators or any other appropriate sources, and they may comprise filters to shape the dither signals. The dashed lines of the dithering blocks indicate that the dither signal may be injected at various points in the data path.

The quantized signal, master-clock pointers MCP, is at last sent to the clock renderer CR together with the master clock MC. The clock renderer CR produces an event clock signal EC from the two signals MCP and MC. Because of the optionally added dither signal(s) and the noise shaping of the quantizing error, and thereby the justification jitter, the spectrum of the justification jitter is smoothed and pushed towards high frequencies.

FIG. 9 shows an embodiment where the High-Performance NCO of the present invention is equipped with auxiliary outputs. These are needed e.g. when the High-Performance NCO of the present invention is a part of a cascade-form Hybrid Synchronizer of the present invention, e.g. a Hybrid Synchronizer as illustrated in FIG. 2B, and described above.

The figure shows a High-Performance NCO of the present invention, as described above and below. As described, it has a period control input PC and an event clock output EC. In this embodiment it additionally outputs a frame sync FS and a feedback signal 111. When the NCO is used within a cascade-form Hybrid Synchronizer as shown in FIG. 2B, the feedback signal 111 is connected to the first detector FD of the first block FBLK.

The establishment of the frame sync FS and feedback signal 111 may be done in different ways, and is in FIG. 9 shown very simple, by use of a simple frequency divider. A different and more sophisticated embodiment of the establishment of the auxiliary signals is described below with reference to FIG. 13.

In some applications there is a need to moderate the peak instantaneous amplitude of the jitter, e.g. so that a following phase detector is not driven beyond its linear range. Some moderation can be achieved by including poles in the noise shaping function. Greater moderation can be achieved by hard limiting in the resolution reducer RR.

This also allows the frequency of the event clock EC to more closely approach that of the master clock MC.

Figure 10:
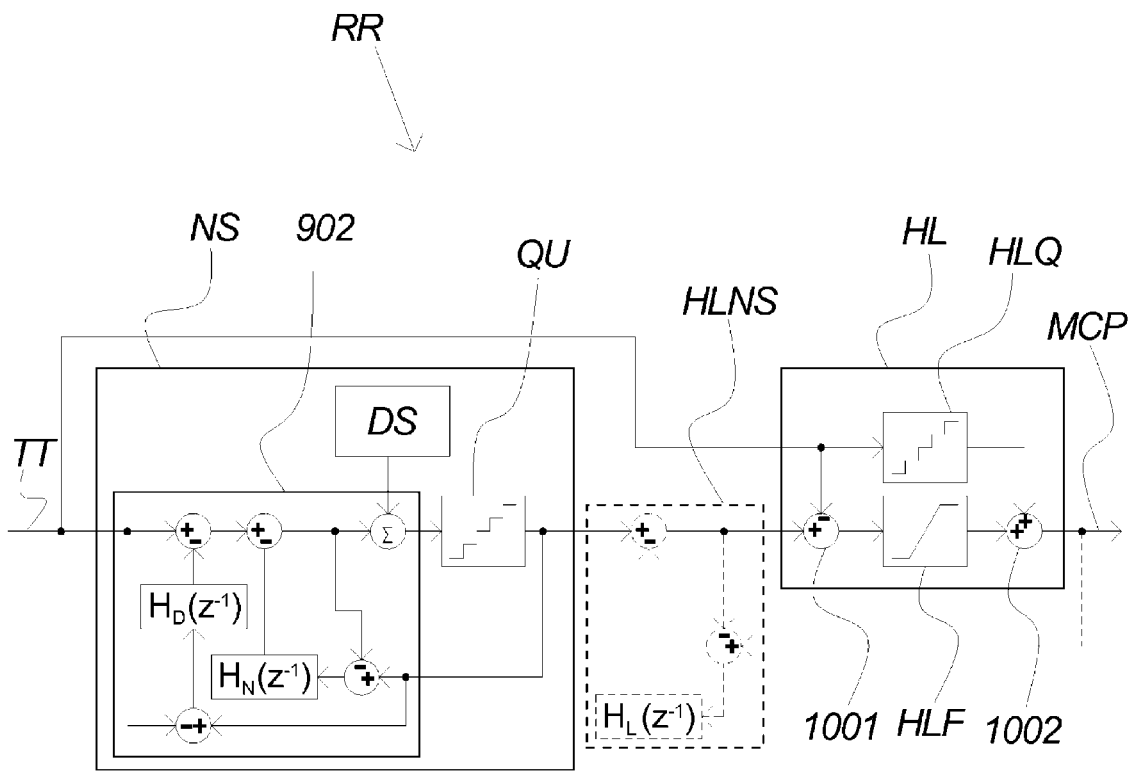
FIG. 10 shows a hard limiter implemented in the resolution reducer.

FIG. 10 shows how a hard limiter can be incorporated within the resolution reducer RR. The limiter controls the quantization error, thereby directly limiting the instantaneous amplitude of the justification jitter. It is even possible to apply separate spectrum shaping to the error component that is introduced by the limiter.

The resolution reducer of FIG. 10 comprises a noise shaper NS, the output of which is sent to a hard limiter HL. The hard limiter HL also has an input connected to the input of the noise shaper NS. The input of the noise shaper NS is the output of the accumulator ACC, i.e. the target-times signal TT. FIG. 10 further comprises an additional noise shaping component HLNS. The dashed lines of the additional noise shaping component HLNS imply that it is not always necessary.

The noise shaper NS of FIG. 10 comprises a dither source DS, a quantizer QU and a detailed view of a preferred noise shaping component 902. The hard limiter HL comprises a quantizer HLQ, a hard limit function HLF and two summing points 1001 1002.

As the hard limiter HL thus has access to both the input and the output of the noise shaper NS, it is able to limit the difference between these, and thereby limit the peak amplitude of the justification jitter.

If the limiting values to be applied are integers, the hard limiter HL can be simplified by removal of the quantizer HLQ and the two summing points 1001 1002.

It is also possible to include a hard limit function directly in the quantization block of a noise shaper. This is well known in the field of delta-sigma modulation.

Clock Rendering

Figure 11A:
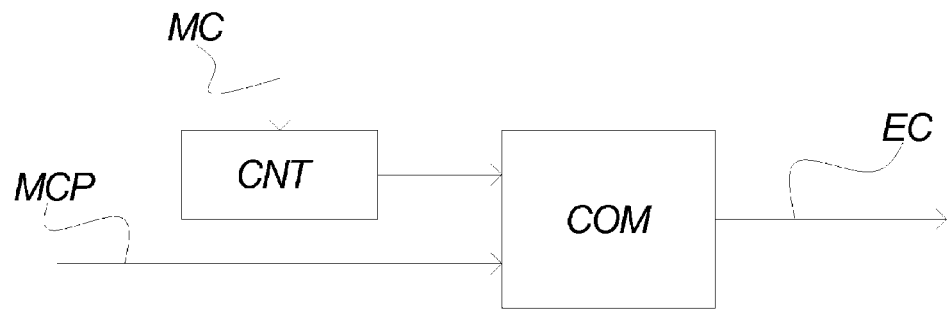
FIG. 11A-11C show three embodiments of a clock renderer.
Figure 11B:
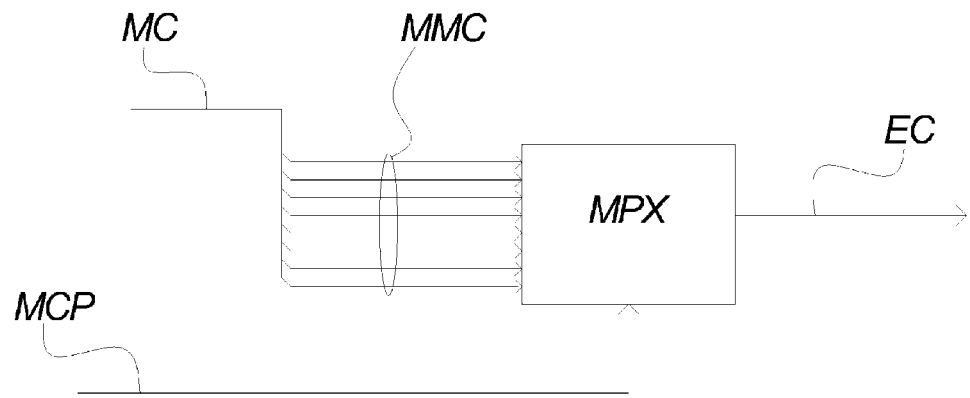
Figure 11C:
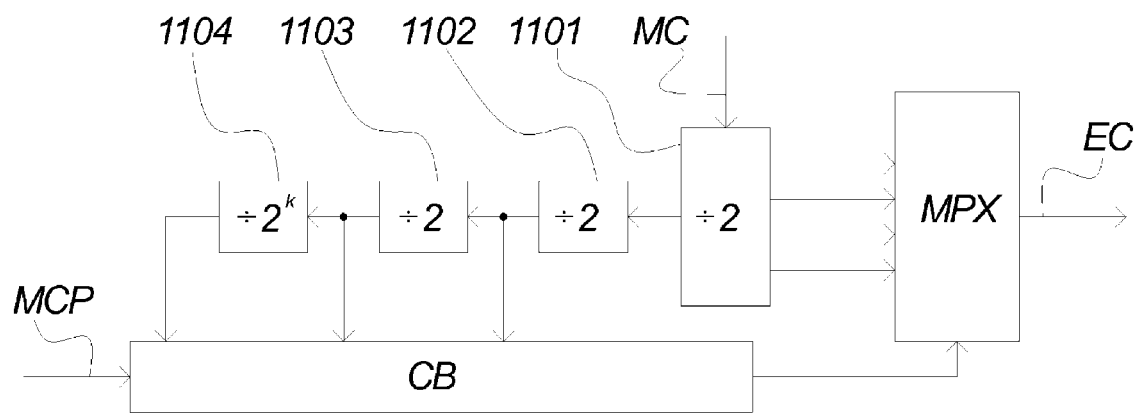

The stream of master-clock pointers MCP may be rendered to an event clock EC in many different ways. One way is to differentiate it, by subtracting the value of each pointer from that of its predecessor, and to apply the differentiated stream to the control input of a multi-modulus divider dividing the master clock MC. FIGS. 11A-11C illustrate three other ways of rendering the event clock EC.

FIG. 11A shows a comparator-based embodiment of a clock renderer CR. It comprises a counter CNT and a comparator COM. The counter CNT has as input the master clock MC, and the comparator COM has as inputs the stream of master-clock pointers MCP and the output of the counter CNT. The output of the comparator COM is the event clock EC.

The counter CNT is a wrapping counter, which preferably has the same capacity as the master-clock pointers. The comparator COM can be of any suitable type including, but not exclusively, identity comparator types and modulo magnitude comparator types. At each master clock MC the comparator COM compares the values of the counter CNT and the current master-clock pointer. If they are equal, an event clock EC pulse is generated.

FIG. 11B shows a multiplexer-based embodiment of a clock renderer CR. It comprises a multiplexer MPX. To the multiplexer MPX are input the master-clock pointer signal MCP and the master clock MC, which is in this case a multiphase master clock MMC. The output of the multiplexer MPX is the event clock signal EC.

A multiphase master clock MMC may physically be established and embodied in several ways, one of which is as such: The multiphase master clock MMC comprises a number of wires, each carrying a clock. The clocks of the different wires all have the same frequency, but have different phase offsets. A multiphase master clock comprising e.g. eight different clocks each with a frequency of e.g. 1 MHz, but also phase shifted 45 degrees to each other, can be interpreted as a single clock with a frequency of 8 MHz. Such a multiphase master clock MMC may be obtained from a multistage delay line, from a ring oscillator, from a delay-locked loop, or from a clocked state machine, but other possibilities are within the scope of this invention, too. The multiplexer MPX dynamically lets the master-clock pointer select one of the phases of the multiphase master clock MMC.

FIG. 11C shows an embodiment of the clock renderer CR that is a combination of the embodiments of FIGS. 11A and 11B. It comprises a control block CB, a multiplexer MPX and a chain of dividers 1101 . . . 1104. The master clock MC clocks the first divider 1101, which outputs a local multiphase clock having four components phase-shifted 90 degrees to each other. The outputs of the other dividers 1102 . . . 1104 are taken to the control block CB, as is the master-clock pointer signal MCP. The multiplexer MPX dynamically selects between the four clock phases and a null signal, under the control of the control block CB. The output of the multiplexer MPX is the event clock EC.

The multiplexer MPX works the same way as with the embodiment of FIG. 11B. The control block CB is used to control when the multiplexer is enabled. This is necessary if the maximum possible value of the master-clock pointer is higher than the number of different phases of the multiphase master clock MMC. The control block CB may comprise a pipelined comparator. A benefit of this embodiment compared e.g. to the embodiment of FIG. 11A is that it can operate with master clocks of much higher frequencies.

The embodiments of FIGS. 11A-11C justify the event clock EC to edges of the master clock MC. Variants are possible in which the edge selection step is followed by or combined with a phase interpolation step. Pairs of consecutive edges might be selected on the basis of the most-significant bits of the master-clock pointers MCP, with one or more of the least-significant bits controlling interpolation between those edges. As is known, phase interpolation can be achieved in a variety of ways, including by summing differently phased finite-slope copies of the master clock.

Two-Stage Circuits

Figure 12:
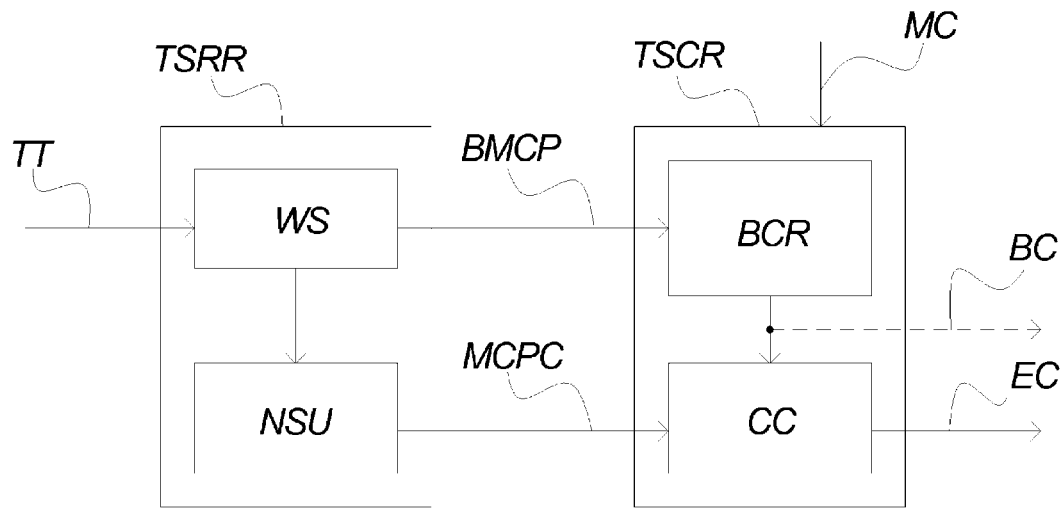
FIG. 12 shows an embodiment where the resolution reducer and the clock renderer have two stages.

FIG. 12 shows an embodiment where the resolution reducer RR and the clock renderer CR are divided into two stages. Basically the figure comprises a two-stage resolution reducer TSRR and a two-stage clock renderer TSCR. The input to the two-stage resolution reducer TSRR is the target-times signal TT, and the output of the two-stage clock renderer TSCR is the event clock EC, and an optional basic clock BC.

The two-stage resolution reducer TSRR comprises a word splitter WS and a noise shaping unit NSU. The word splitter WS splits the target-times signal TT into an integer part, being a stream of basic master-clock pointers BMCP, and a fractional part, which is sent to the noise shaping unit NSU. This approach makes the implementation of noise shaping and optionally hard limiting less complicated, as it is now only the fractional part that is to be processed, instead of numbers of arbitrary magnitude. The noise shaping unit NSU may be any of the types described above as noise shaper NS of FIG. 8B, or other suitable noise shaping units, and it may comprise a hard limiter HL e.g. as described with reference to FIG. 10 above. The output of the noise shaping unit NSU is an integer-valued stream of master-clock pointer corrections MCPC, which together with the basic master-clock pointers BMCP form pointers to the master clock MC.

The two-stage clock renderer TSCR comprises a basic clock renderer BCR and a clock corrector CC. In addition to the basic master-clock pointers BMCP and the master-clock pointer corrections MCPC, it receives the master clock MC. The basic master-clock pointers BMCP are input to the basic clock renderer BCR, which generates a basic clock BC by using them as pointers to edges of the master clock MC. The basic clock BC is input to the clock corrector CC, which applies the information given by the master-clock pointer corrections MCPC to it. The clock corrector CC may be implemented as a variable delay, but any other implementation is within the scope of this invention. The basic clock BC is also useful in its own right, in some applications, and is therefore shown as an optional output of the clock renderer CR. It is more regular than the event clock EC, and is therefore more suited to such things as the regulation of signal flows in pipelined circuits, which may include the accumulator ACC and the resolution reducer RR.

In some digital signal processing applications, it is useful for the NCO to provide a residue signal, being simply a stream of numbers representing the justification jitter. Such a signal may readily be made available from the High-Performance NCO of the present invention, as may other auxiliary outputs, including counts and additional clocks. A count might be e.g. the local system time count of an MPEG-2 System, or the local cycle time count of an IEEE 1394 bus. Additional clocks might have different noise shaping and/or frequency to the primary clock output.

FIG. 13 illustrates an embodiment where the High-Performance NCO of the present invention is equipped with auxiliary outputs. The figure is the same as FIG. 12 above, except for the addition of a divider 1201, a frame sync output FS and a feedback output FBO.

The feedback output FBO is formed by the basic clock BC, which is the output of the basic clock renderer BCR, plus a fractional part FP, which is the output of the word splitter WS, plus a basic frame sync BFS which is the output of the divider 1201. Such a feedback output is advantageous when the High-Performance NCO of the present invention is a part of a cascade-form Hybrid Synchronizer of the present invention, e.g. a Hybrid Synchronizer as illustrated in FIG. 2B.

The divider 1201 produces a basic frame sync signal BFS by dividing the basic clock BC. If this signal is variably delayed by the clock corrector CC in the same way as the basic clock BC, the frame sync signal FS is generated.

Justification Jitter

Figure 14:
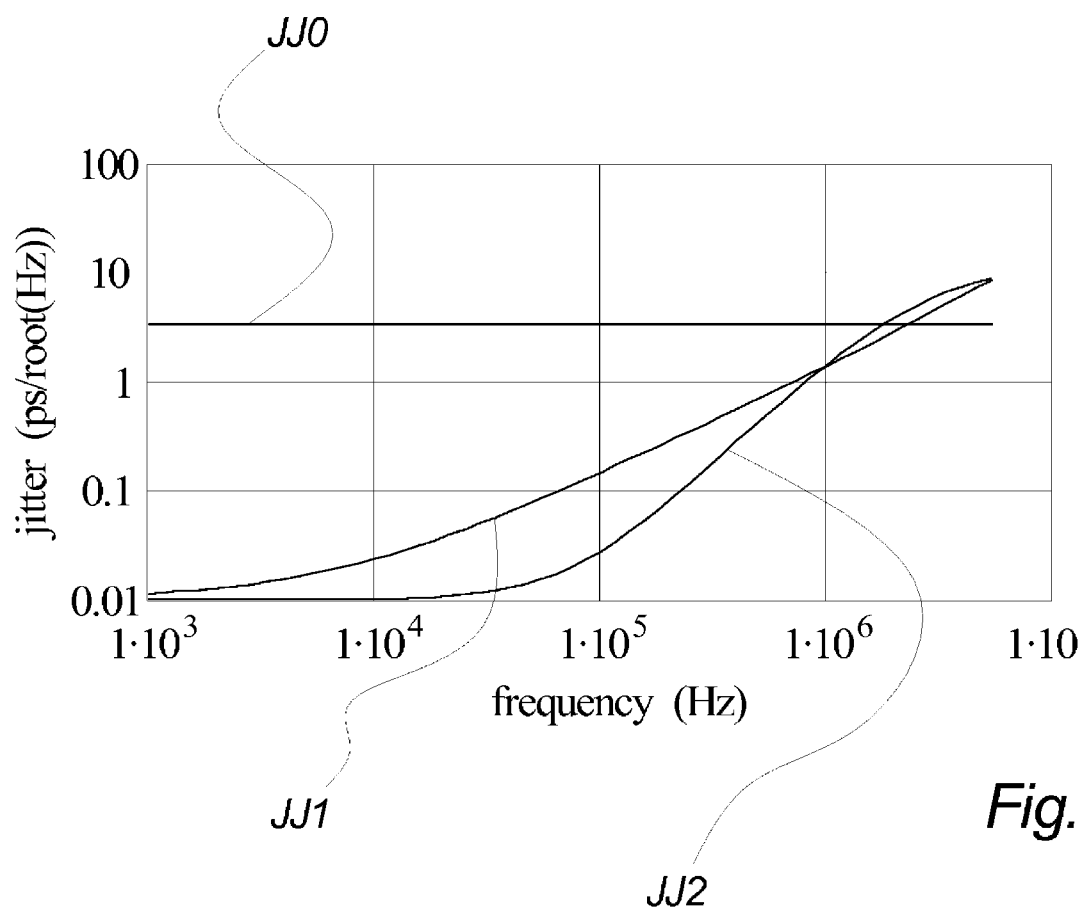
FIG. 14 shows the spectral density of the justification jitter from the High-Performance NCO when different levels of noise shaping are performed.

FIG. 14 shows the results of different levels of noise shaping within the High-Performance NCO of the present invention. It comprises three curves JJ0 JJ1 JJ2. The horizontal axis is logarithmic, and contains frequency values measured in Hz (Hertz). The vertical axis is also logarithmic, and contains the jitter spectral density, with $$\frac{ps}{\sqrt{Hz}}$$

(picoseconds per root Hertz) as units of measure.

The first curve JJ0 shows the spectral density of the justification jitter output by the High-Performance NCO of the present invention, when the resolution reducer RR incorporates just dithered quantization. The curve clearly shows that the justification jitter is then equally distributed throughout the whole spectrum.

The second curve JJ1 also shows the spectral density of the justification jitter, but this time a dithered first order noise shaping circuit is placed within the resolution reducer RR. This circuit has been configured to bias the justification jitter to higher frequencies, where it may be less troublesome and is easier to remove. It can be seen from the curve how the low frequency jitter for frequencies up to approximately 10 kHz is reduced by more than one-hundred times compared to the case without noise shaping, and how the high frequency jitter is increased instead.

The third curve JJ2 again shows the spectral density of the justification jitter, this time with a second order noise shaping circuit placed within the resolution reducer RR. It is clear that the second order noise shaping circuit is a great improvement to the first order shaping. With second order shaping the reduction is more than one-hundred times from the low frequencies to as high as 100 kHz.

Composite Clocks

The output clock OC and also the intermediate clock IC are possibly composite signals comprising both an event clock component OEC IEC and a framing component OFS IFS. They may have several different physical formats in different embodiments of the invention. For example, the framing component may be part of a time count. Further examples of composite formats are given in FIGS. 15A-15D. Also possible is to code the event clock and framing on a single wire.

Figure 15A:
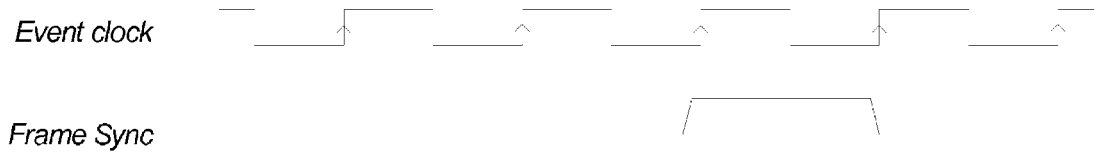
FIG. 15A-15D illustrate some of the possible formats for a composite clock signal having an event clock component and a framing component.

FIG. 15A shows an example of a composite clock comprising two signal wires. The first wire is used for the event clock information, and the second wire is used to transmit frame sync information. In the example five event-clock pulses are shown, and one frame sync pulse. There are no physical restrictions as to the number of event-clock pulses corresponding to each frame sync pulse.

Figure 15B:
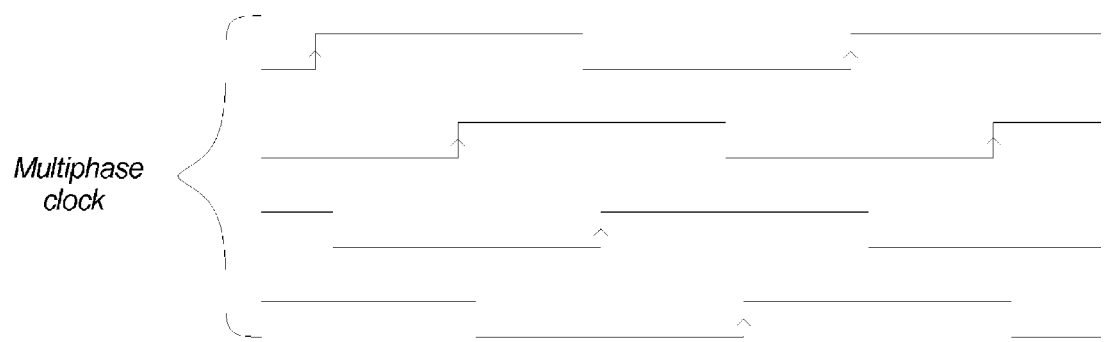

FIG. 15B shows an example of another format, a multiphase clock, which also is capable of carrying both event clock and frame sync information. The physical connection is established by means of several wires. In the example given, four wires are used, thereby physically defining a frame to comprise four event-clock pulses. The frame information is derived by reading only one of the wires, whereas the event clock information is derived by considering the four wires all together.

Figure 15C:
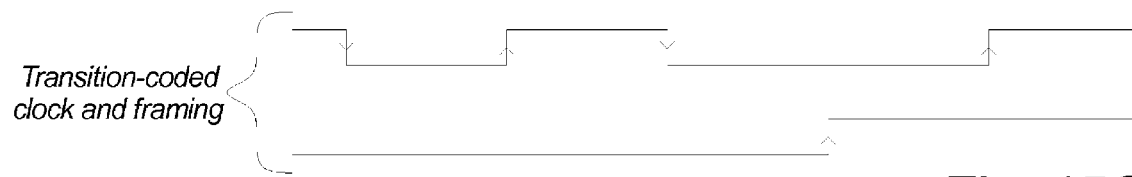

An additional exemplary format is shown in FIG. 15C. This format requires two wires, the signals of which are both modulated with the event clock information and the frame sync information. For every event-clock pulse there is a corresponding transition (edge) on one of the wires. The transition is normally on the first wire, but is on the second wire at frame boundaries. This format has no restrictions regarding the number of event-clock pulses corresponding to each frame.

Figure 15D:
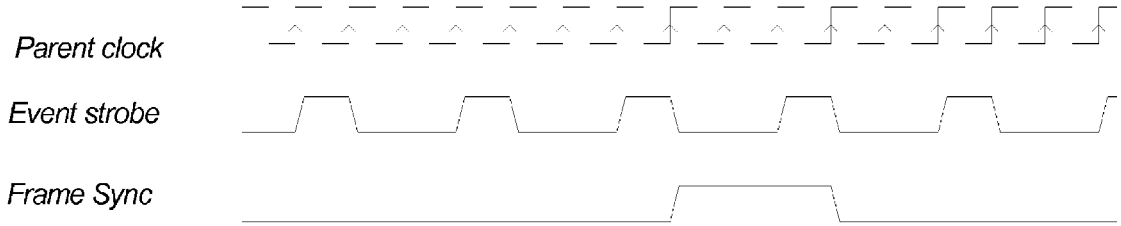

The last example of a composite format given, whereas not the last possible such format within the scope of this invention, is shown in FIG. 15D. This format requires three wires. The first wire is used for transmitting a parent clock to which the event clock and the frame sync signals are referred. The second wire is used solely for transmitting the event-clock pulses, which are separated by a fixed or variable number of parent-clock pulses. The third wire is used for the transmission of the frame sync signal, the pulses of which are spaced by a fixed number of event-clock pulses. With this signal format there are no physical restrictions regarding the number of event-clock pulses corresponding to each frame sync pulse.

Frame Locking

As mentioned above when describing the cascade-form Hybrid Synchronizer of FIG. 2B, the second detector takes as reference input both an intermediate event clock IEC and an intermediate frame sync IFS, and compares these to the feedback inputs 112 113, which are derived from the output event clock OEC and the output frame sync OFS. As a clock signal and its corresponding frame sync signal by definition ought to be synchronized, the detector used as second detector SD for the cascade form of the Hybrid Synchronizer of the present invention must be able to do phase detection on both the event clock signal and the frame sync signal and furthermore keep them synchronized to each other. What requirements and solutions this synchronization comprises depend on the actual application. A possible requirement may be to preserve the same number of clock events in each frame. If the timing of the frame sync signal is most important, a solution may be to remove or add clock events to each frame, letting the frame timing be constant and the clock event timing variable. If the clock timing is most important, the opposite solution may be obvious, thus preserving the original clock events, but stretching or shrinking each frame accordingly. Several other requirements and solutions to the synchronization problem are possible.

As seen above, it is important when locking to a composite clock signal comprising several signals synchronized to each other, by means e.g. of a phase detector or a phase-locked loop, that this synchronization is preserved, even though the timing, phase or frequency of the signal may be adjusted by the phase-locked loop.

In one common approach to the problem, the phase detector of the phase-locked loop is run at the frame rate rather than the clock rate, thus discarding the clock signal. However, as well as causing jitter aliasing, this lowers the signal-to-noise ratio and raises the loop delay. This in turn forces the loop bandwidth down, leading to higher intrinsic jitter and greater susceptibility to interference. Moreover a crystal-based oscillator is often necessary to make it work well.

By running the phase detector at the event clock rate, these problems can be sidestepped, but the frame sync signal is thus discarded, whereby omitting frame locking. The output frame sync signal is established by dividing the output clock signal. A common way to yet facilitate frame locking, is to use the reference frame sync signal to reset the divider generating the output frame sync signal. One significant disadvantage of this technique is that it causes some output frames to have a different number of event clocks, which is undesirable in most applications.

A common solution to this problem is to add a pulse swallower, being a block that selectively blanks out some of the event-clock pulses, to the divider, thereby avoiding the clock events in excess. On the other hand, the pulse swallower is not able to add clock events to a frame having insufficient clock events. Another drawback of the pulse swallower solution is the irregular time gaps arising in the output clock signal instead of the superfluous clock events.

The loop bandwidth compromises, frame length errors and clock discontinuities described above may be avoided by using a new type of phase/time detector, which will now be described.

Combined Clock-and-Frame Asynchrony Detection

An asynchrony detector according to an embodiment of the present invention is a phase or time detector that can respond not just to the primary components of its input signals, but also to secondary components of those signals. Consequently it may be configured to measure the phase/time offset between composite clocks each comprising e.g. an event clock component and a framing component.

Such a detector may be referred to as a combined clock-and-frame asynchrony detector, or just as a Combined Detector.

A Combined Detector according to the present invention enables the cascade-form Hybrid Synchronizer of FIG. 2B. However, it is emphasized that it is in no way limited to such use, but may also be used in other circuits and applications.

Figure 16:
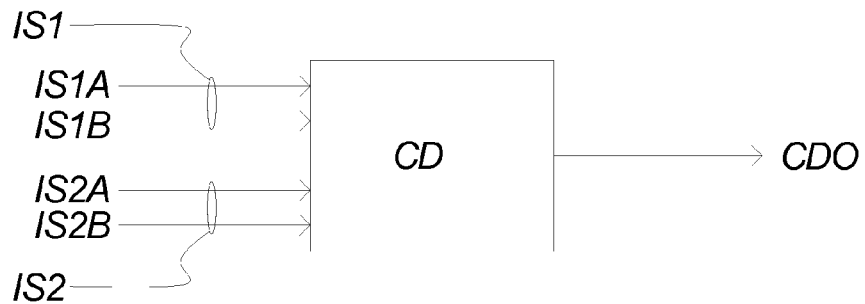
FIG. 16 shows an outline of the Combined Detector of the present invention.

FIG. 16 shows an outline of a Combined Detector CD of the present invention. As inputs the Combined Detector CD has a first input signal IS1 and a second input signal IS2. Each input signal IS1 IS2 comprises a first signal component IS1A IS2A and a second signal component IS1B IS2B. The information carried by the first signal component IS1A of the first input signal IS1 is comparable to the information carried by the first signal component IS2A of the second input signal IS2. Accordingly the information carried by the second signal components IS1B IS2B of each input signal IS1 IS2 is comparable. The Combined Detector CD has one output CDO, which may be established according to the phase/time difference between the first signal component IS1A of the first input signal IS1 and the first signal component IS2A of the second input signal IS2. Alternatively the Combined Detector CD may choose to establish the output signal CDO according to the phase/time difference between the second signal components IS1B IS2B of each input signal IS1 IS2. Furthermore the Combined Detector CD may establish the output signal CDO partly according to the phase/time difference between the first signal components IS1A IS2A of each input signal IS1 IS2, and partly according to the phase/time difference between the second signal components IS1B IS2B. It is noted that embodiments of the Combined Detector of the present invention having more than two input signals and/or more than two components for each signal, thus being able to establish the output CDO on the basis of phase/time differences measured between any combination of any signal components of any input signals, are fully within the scope of the present invention.

Different criteria for when the Combined Detector should use one method, and when it should use another, may be established. One preferred criterion could be to normally let the phase/time difference between the first signal components IS1A IS2A control the output, but simultaneously monitor the phase/time difference between the second signal components IS1B IS2B, and if it exceeds a predefined threshold then let it control the output, until the phase difference has fallen below that threshold.

The Combined Detector of the present invention may be implemented with continuous-time parts and/or discrete-time parts, and its output my represent a phase angle or a time interval. However, for concreteness our description and presented embodiments are of Combined Detectors that operate in continuous time and do phase detection.

In the following, different embodiments of the Combined Detector of the present invention are described in the context of a cascade-form Hybrid Synchronizer of the present invention. This is due to simplicity of the descriptions given, and it is hereby stated, that the use of the Combined Detector alone, as well as in any application context, is within the scope of the present invention.

Using Interleaving

Figure 17:
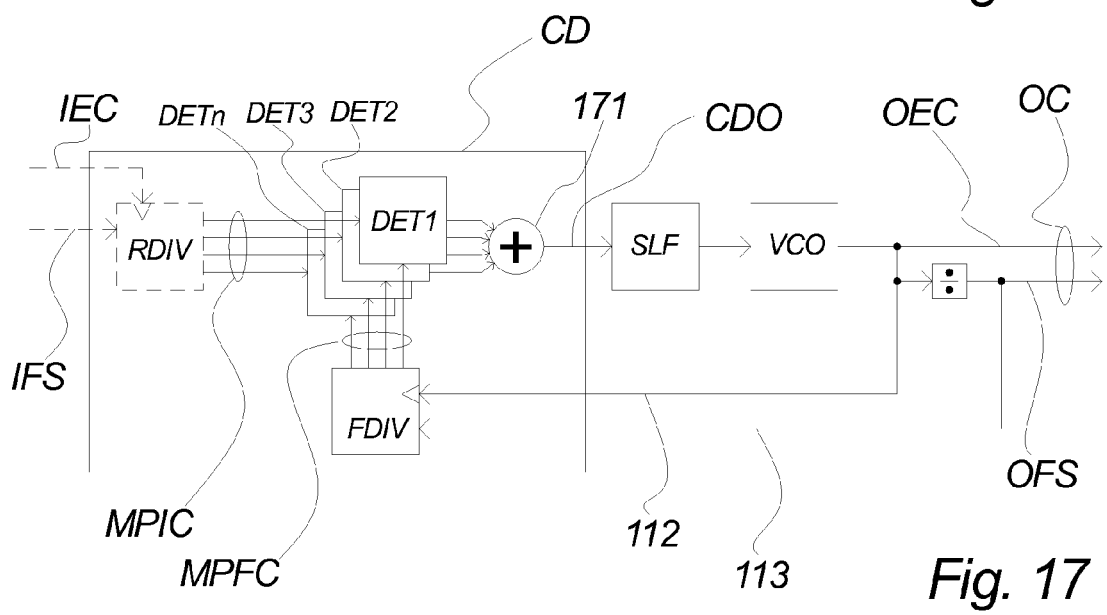
FIG. 17 shows an embodiment of a Combined Detector using interleaved detectors.

FIG. 17 shows a first embodiment of the Combined Detector invention implemented as second detector SD of the cascade form of the Hybrid Synchronizer of the present invention. FIG. 17 comprises the second block SBLK of the Hybrid Synchronizer. In accordance therewith, the Combined Detector CD is shown with two pairs of inputs: The intermediate clock corresponding to first input signal IS1 of FIG. 16 comprising an intermediate event clock IEC and an intermediate frame sync IFS, and a feedback signal corresponding to second input signal IS2 of FIG. 16 comprising a feedback event clock 112 and a feedback frame sync 113. Together with the Combined Detector CD, FIG. 17 further comprises the second loop filter SLF, the voltage-controlled oscillator VCO and the divider of the Hybrid Synchronizer second loop. As mentioned above, the Combined Detector is shown with these components and wirings due to exemplification only.

The Combined Detector CD of FIG. 17 comprises a bank of basic detectors DET1 . . . DETn, which are interleaved. They are preferably conventional phase detectors, but may also be time detectors or other kinds of asynchrony detectors. That the drawing comprises exactly four basic detectors is due to exemplification, and it is noted that any number of basic detectors is within the scope of the invention. Recognized as one unit, the bank of basic detectors takes two inputs, a multiphase intermediate clock MPIC, derived from the intermediate clock, and a multiphase feedback clock MPFC, derived from the feedback signal. Each of these comprises several separate wires, one for each basic detector DET1 . . . DETn, thereby facilitating a multiphase clock e.g. physically represented as shown in FIG. 15B, to be used as input to the detector bank.

The multiphase intermediate clock MPIC may be established from an intermediate clock signal IC, comprising an intermediate event clock IEC and an intermediate frame sync IFS, by the use of an reference divider RDIV having a clock input connected to the intermediate event clock IEC, and having another input connected to the intermediate frame sync IFS. This enables the Combined Detector to be connected to the output of the High-Performance NCO of the present invention in the cascade form of the Hybrid Synchronizer of the present invention.

The multiphase feedback clock MPFC my be established in a similar way, by means of a feedback divider FDIV, which clock input is the feedback event clock 112, and second input is the feedback frame sync 113. With the cascade-form Hybrid Synchronizer example of FIG. 17, the feedback event clock 112 is derived from the output event clock OEC, and the feedback frame sync 113 is derived from the output frame sync OFS.

The reference divider RDIV and the feedback divider FDIV both frequency-divide their inputs by e.g. four, when four basic detectors DET1 . . . DETn are present. They provide multiphase outputs with components at e.g. 0, 90, 180 and 270 degrees. Each basic detector DET1 . . . DETn then establishes an output according to the phase or frequency difference between its inputs, and these outputs are summed within a summing point 171. The Combined Detector output CDO is used to control the voltage-controlled oscillator VCO.

Any one of the basic detectors DET1 . . . DETn would be able to lock the loop on its own, but by having a number of basic detectors, e.g. four, working simultaneously, the aggregate detection rate equals the clock rate rather than the frame rate.

The reference divider RDIV together with its inputs IEC IFS are shown dashed, because an alternative embodiment of the Combined Detector CD omits these, and instead takes a multiphase input MPIC directly from the source. Similarly the feedback divider FDIV may optionally be combined with the divider block 18 of the second block SBLK of the cascade-form Hybrid Synchronizer.

This embodiment of the Combined Detector of the present invention features a wide linear range.

Using Counters

When a frame contains a large number of clock periods, the embodiment described above becomes impractical, as an accordingly large number of basic detectors would be necessary. An embodiment of the Combined Detector of the present invention that more efficiently enables the use of long frames is shown in FIG. 18.

This embodiment is based on the use of one or more counters, and again the Combined Detector is shown as second detector SD of the cascade form of the Hybrid Synchronizer of the present invention. It comprises a reference counter RCTR, a feedback counter FCTR, an asynchronous summer 181 and a digital-to-analog converter DAC. The reference counter RCTR and the feedback counter FCTR are wrapping modulo-N counters, where N is the frame length, i.e. the number of clock events comprised in each frame. The counter values RCV FCV output by the counters RCTR FCTR comprise numeric values in digital form, therefore requiring buses of a certain width.

Figure 18:
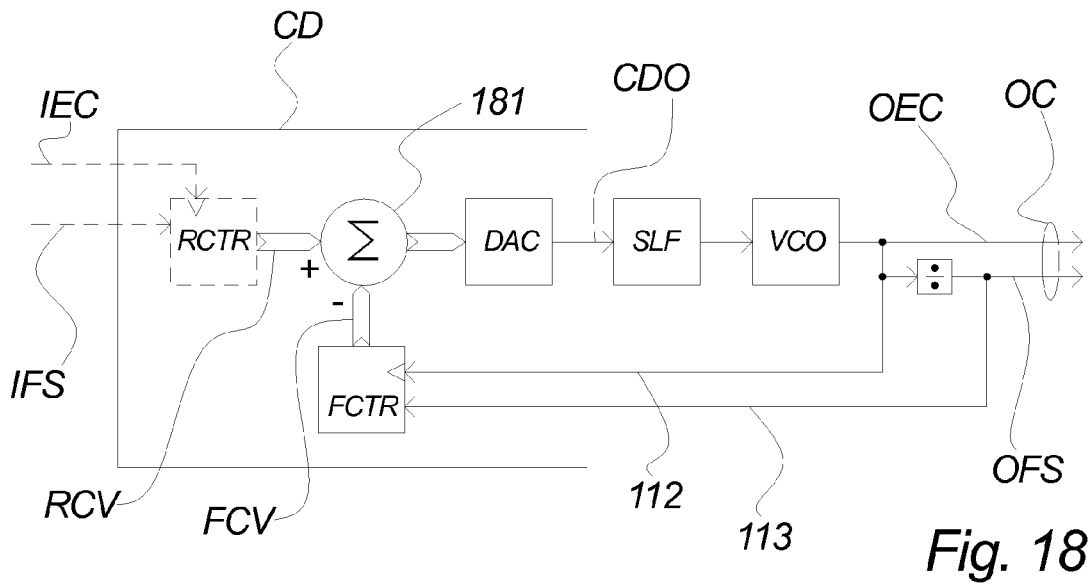
FIG. 18 shows an embodiment of a Combined Detector using counters.

The Combined Detector CD of FIG. 18 has four inputs, an intermediate event clock IEC and intermediate frame sync IFS, together forming the intermediate clock IC, and a feedback event clock 112 and feedback frame sync 113. The intermediate event clock IEC and intermediate frame sync IFS are connected to the reference counter RCTR, and the feedback event clock 112 and feedback frame sync 113 are connected to the feedback counter FCTR. The Combined Detector further comprises one output CDO.

The embodiment of FIG. 18 further comprises a second loop filter SLF corresponding to the second loop filter of FIG. 2B, feeding a voltage-controlled oscillator VCO corresponding to the voltage-controlled oscillator of FIG. 2B, feeding a divider corresponding to the divider block 18 of FIG. 2B. These components may be implemented as described above regarding the Hybrid Synchronizer of the present invention. The VCO provides the output event clock OEC, which is also fed back as the feedback event clock 112. The divider provides the output frame sync OFS, which is also fed back as the feedback frame sync 113.

The reference counter RCTR counts the clock events of the intermediate event clock IEC. It is frame-locked to the intermediate frame sync signal IFS. The feedback counter FCTR counts the clock events of the feedback event clock 112, and is frame-controlled by the feedback frame sync 113. The asynchronous summer 181 performs e.g. modulo-N subtraction of the counter values RCV FCV, outputting a number e.g. in the range –½N to +½N. This counter difference is converted to an analog value CDO by the digital-to-analog converter DAC, and this analog value CDO is used to control the voltage-controlled oscillator VCO.

This embodiment of the Combined Detector of the present invention features rapid pull-in, and a wide linear range.

It is noted that the digital-to-analog converter DAC may have fewer output levels than input levels. For example, it might have a saturating characteristic and just two output levels, representing the numbers –½ and +½. This would reduce the implementation cost, but would also significantly reduce the linear range.

FIGS. 17 and 18 emphasize the similarities between embodiments that use interleaving and embodiments that use counters. It should be apparent that these two approaches may be used together. Adding a degree of interleaving to a counter-based embodiment may make it significantly more tolerant of input jitter.

The counter-based embodiment of FIG. 18 may be varied in several ways. As it may be beneficial to sidestep the need for an asynchronous summer 181, other ways of determining the phase or frequency difference between the intermediate frame sync and the feedback frame sync are possible. One such variant may be implemented using a dual-flip-flop phase detector commonly known in the art, by adding to it slip detection, frame capture and a synchronous state machine. Another possibility is to replace the two counters RCTR FCTR with a single asynchronous up/down counter.

More generally, it is noted that Combined Detectors may be built around many different types of conventional detectors. The additional circuitry might augment or override the conventional detector's outputs(s). Alternatively or additionally it might pre-process the conventional detector's inputs.

Using Flancters

Figure 19A:
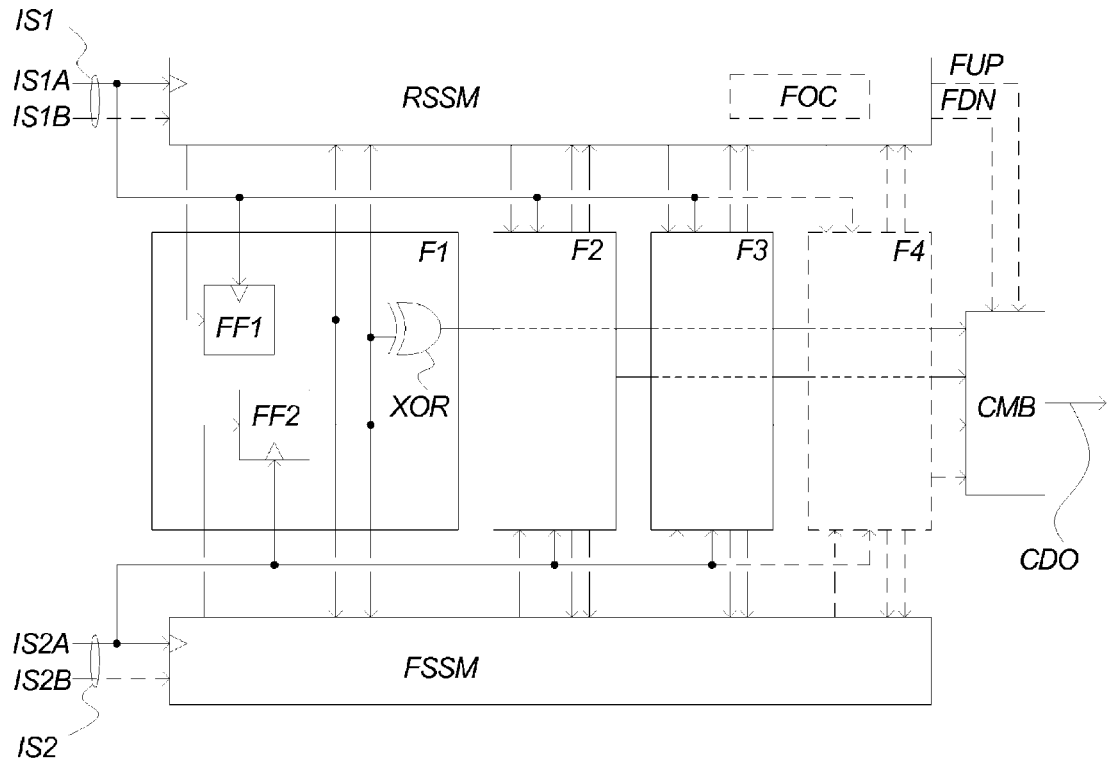
FIG. 19A shows an embodiment of a Combined Detector using state machines and flancters.

Solutions using asynchronous summers or counters are prone to problems associated with glitching and metastability. FIG. 19A shows a more sophisticated embodiment of the Combined Detector of the present invention, which addresses these issues. Unlike FIGS. 17 and 18, this embodiment is not shown in the context of the second block of a cascade-form Hybrid Synchronizer of the present invention. This is due to the complexity of the embodiment, and it is noted that this embodiment as well as the other possible embodiments of the Combined Detector may be used as second detector in a cascade-form Hybrid Synchronizer, or in any other application that would benefit from implementing frame locking together with or instead of conventional clock locking. The embodiment of FIG. 19A may thus contextually correspond to the second detector SD of FIG. 2B.

The embodiment comprises a reference synchronous state machine RSSM which is clocked by a first component IS1A of a first input signal IS1, and a feedback synchronous state machine FSSM which is clocked by a first component IS2A of a second input signal IS2. The first components IS1A IS2A may correspond to the intermediate event clock IEC and the feedback event clock 112 of FIG. 2B. Furthermore the embodiment comprises a number of "flancters" F1 ... F4, and a combinatorial block CMB. A flancter is a small circuit that establishes a status flag, which is set in one clock domain and cleared in another. Each flancter comprises two flip-flops FF1 FF2, and is connected to the combinatorial block CMB by its primary output, which is generated as the logical exclusive-or XOR of the states of those flip-flops FF1 FF2. In each flancter, the first flip-flop FF1 is clocked by the first component IS1A of the first input signal IS1, and is driven from the reference synchronous state machine RSSM, and the second flip-flop FF2 is clocked by the first component IS2A of the second input signal IS2, and is driven from the feedback synchronous state machine FSSM. Each state machine RSSM FSSM sees the outputs of all the flip-flops FF1 FF2 of all the flancters F1 ... F4. Where signals cross clock boundaries, they are synchronized typically using the standard cascade of two flip-flops, not shown. The state machines RSSM FSSM are internally configured such that the flancters' primary outputs are only ever set from the reference side, and are only ever cleared from the feedback side.

The portion of FIG. 19A that is shown in solid lines, which includes just three of the four flancters, can be used on its own as a non-frame-locking phase-frequency detector. On every event on the first component IS1A of the first input signal IS1 exactly one of the flancters F1 ... F3 is set, unless they are all already high. On every event on the first component IS2A of the second input signal IS2, exactly one of the flancters F1 ... F3 is cleared, unless they are all already low. Together, the bank of flancters F1 ... F3 forms a unary counter, as the number of them that are high indicates how many clock periods are between corresponding events on the first components IS1A IS2A of the two input signals IS1 IS2. The more the first component IS1A of the first input signal IS1 is ahead of the first component IS2A of the second input signal IS2, the more flancters will be high. To enable the system to know whether the first component IS2A of the second input signal IS2 is ahead of the first component IS1A of the first input signal IS1, some of the flancters are initially set to high, thus giving the unary counter an offset. The combinatorial block CMB establishes a Combined Detector output signal CDO on the basis of the flancter outputs, such that e.g. zero or one high flancter causes the output signal CDO to be instantaneously low, and two or three high flancters causes the output signal CDO to be instantaneously high. The output signal CDO is e.g. used to control a voltage-controlled oscillator VCO, in turn controlling e.g. the second input signal IS2 by means of feedback wiring, as e.g. shown in FIG. 2B. When the first component IS2A of the second input signal IS2 is synchronized to the first component IS1A of the first input signal IS1, the number of high flancters will be alternating between one and two, in turn causing the output signal CDO to alternate between low and high.

To implement locking to a second signal component, carrying e.g. frame sync information, the embodiment of FIG. 19A further comprises a fourth flancter F4, a frame offset counter FOC, a force-up signal FUP and a force-down signal FDN. Furthermore a second component IS1B of the first input signal IS1 is input to the reference synchronous state machine RSSM, and a second component IS2B of the second input signal IS2 is input to the feedback synchronous state machine FSSM. The second components IS1B IS2B may correspond to the intermediate frame sync IFS and the feedback frame sync 113 of FIG. 2B.

The unary counter is now four bits wide. Additionally the fourth flancter F4 is used to communicate the timing of the e.g. feedback frame sync IS2B to the frame offset counter FOC. This may be done, for example, by having the feedback synchronous state machine FSSM clear the fourth flancter F4 only on feedback event clocks IS2A that correspond to feedback frame boundaries. The frame offset counter FOC is clocked by the first component IS1A of the first input signal IS1, and is controlled by the fourth flancter F4 in such a way that it keeps record of the offset between the feedback framing and the reference framing, this offset being measured in units of clock cycles on the first component IS1A of the first input signal IS1. The frame offset counter FOC may be a wrapping counter with a range of $-\frac{1}{2}N$ to $+\frac{1}{2}N$, where N is the frame length, i.e. the number of clocks in one frame.

As the circuit still detects phase differences between the clock inputs by means of the flancters, and subsequently controls their synchronization, but does not know which event on the first component IS2A of the second input signal IS2 corresponds to which event on the first component IS1A of the first input signal IS1, the combinatorial block CMB's normal behaviour is overridden by the force-up and force-down signals FUP FDN. These signals are controlled according to the frame offset counter FOC, and cause the output signal CDO of the combinatorial block CMB to e.g. stay high, even though the first components IS1A IS2A are synchronized. As the difference between the second components IS1B IS2B disappears, the frame offset counter will evaluate to zero, causing neither the force-up FUP nor the force-down FDN signal to be active, and again letting the combinatorial block CMB establish the output CDO on the basis of the flancters' outputs.

To allow the frame offset counter FOC to be maintained accurately through clock slips, it is useful to keep the unary counter from hitting its end-stops. This can be done by having the reference synchronous state machine RSSM set not one but two flancters when the unary count is particularly low, and similarly, by having it set zero flancters when the unary count is particularly high. Such adjustments must be accompanied by corresponding changes to the frame offset counter FOC. Using more than four flancters can ease the timing of such adjustments.

Figure 19B:
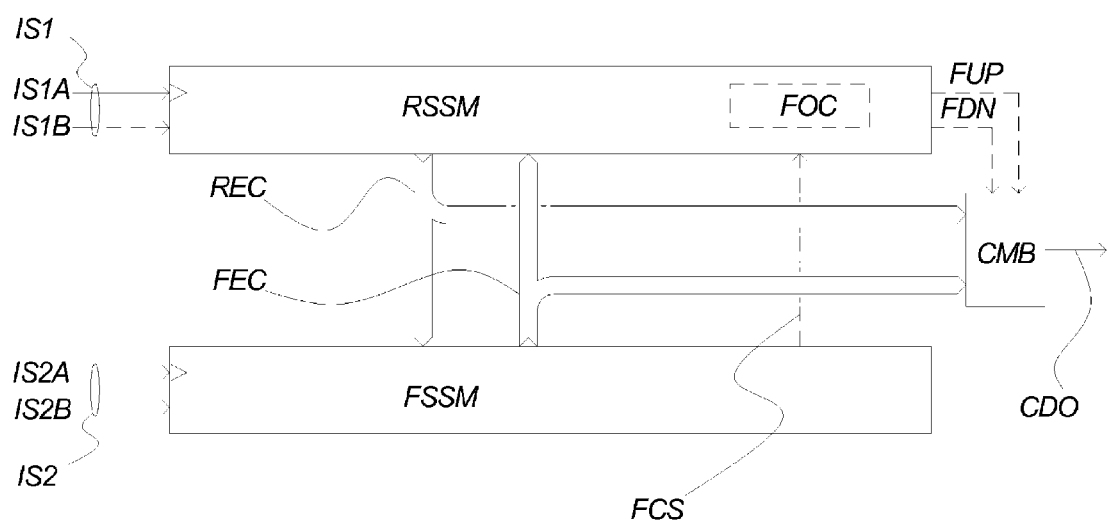
FIG. 19B shows a preferred embodiment of a Combined Detector using state machines.

FIG. 19B shows an embodiment of the Combined Detector. As with FIG. 19A described above, and for the same reasons, this embodiment is not shown in the context of the second block of the cascade form of the Hybrid Synchronizer of the present invention.

This embodiment comprises a reference synchronous state machine RSSM which is clocked by a reference event clock, being a first component IS1A of a first input signal IS1. It further comprises a feedback synchronous state machine FSSM which is clocked by a feedback event clock, being a first component IS2A of a second input signal IS2. It further comprises a combinatorial block CMB and a frame offset counter FOC. The reference state machine RSSM outputs a reference event count REC to the combinatorial block CMB, and this signal is also copied to the feedback state machine FSSM. Similarly, the feedback state machine outputs a feedback event count FEC to the combinatorial block, which signal is also copied to the reference state machine RSSM. Additionally a frame communication signal FCS is connected from the feedback state machine FSSM to the reference state machine RSSM. The frame offset counter FOC is clocked synchronously to the reference state machine RSSM and has access to signals in the reference state machine RSSM. In the shown embodiment it is placed within the reference synchronous state machine RSSM, but it may, in alternative embodiments within the scope of the present invention, be placed either in a different synchronous state machine or outside any state machine. The frame offset counter FOC outputs a force-up signal FUP and a force-down signal FDN, which are connected to inputs of the combinatorial block CMB. On the basis of the event counts REC FEC from the synchronous state machines RSSM FSSM and the control signals FUP FDN from the frame offset counter FOC, the combinatorial block CMB establishes an output signal CDO.

The reference event count REC is a wrapping gray-coded value that is normally incremented by the reference state machine RSSM at every reference event clock. Likewise, the feedback event count FEC is a wrapping gray-coded value that is normally incremented by the feedback state machine FSSM at every feedback event clock. The combinatorial block CMB normally drives its output CDO high or low according to the sign of the difference between the reference event count REC and the feedback event count FEC. This count difference is evaluated in offset modulo maths. For reliable acquisition, the state machines actually only increment their counts when this cannot cause the count difference to wrap. In this way, the circuit's core behaviour is that of a phase-frequency detector. The event counts may for example be four bits wide. The required width is independent of the frame length N.

A reference frame sync IS1B and a feedback frame sync IS2B, being second components of the two input signals IS1 IS2, are applied to the reference and feedback state machines RSSM FSSM respectively. The feedback state machine communicates the occurrence and timing of feedback frame syncs to the reference state machine RSSM via the frame communication signal FCS. This communication may include an indication of the value of the feedback event count FEC that was associated with the most recent frame boundary. The frame offset counter FOC is controlled in such a way that it keeps record of the offset between the reference frame sync IS1B and the feedback frame sync IS2B, this offset being measured in units of reference event clock cycles. The force-up and force-down signals FUP FDN are controlled according to the frame offset counter FOC. They override the normal behaviour of the combinatorial block CMB, causing its output CDO to e.g. stay high, even though the event clocks IS1A IS2A are synchronized. As the offset between the frame syncs IS1B IS2B disappears, the frame offset counter will evaluate to zero, causing neither the force-up FUP nor the force-down FDN signal to be active, and again letting the combinatorial block CMB establish the output CDO on the basis of the count difference.

Known ways of extending phase detector linear range may readily be applied to the Combined Detector embodiments described with FIGS. 19A and 19B, in which case the output CDO typically becomes a multi-wire signal.

The embodiments of FIGS. 19A and 19B have been described assuming the type of composite clock and frame sync signals illustrated in FIG. 15A above. It is noted that embodiments similar to those of FIGS. 19A-19B may be derived using any of the other signal types described with the FIGS. 15B-15D or any other composite signal comprising an event clock component and a framing component. Other variants of the embodiment described with reference to FIGS. 19A and 19B uses e.g. flip-flops that trigger on both edges, facilitating the use of even more different clock signal types.

Transfer Characteristics

Figure 20A:
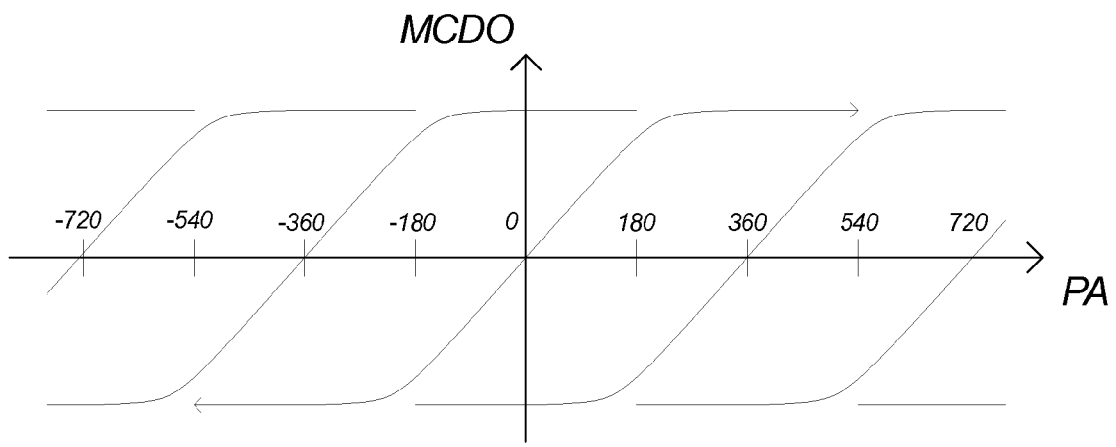
FIG. 20A-20C show phase detector transfer characteristics according to different embodiments.
Figure 20B:
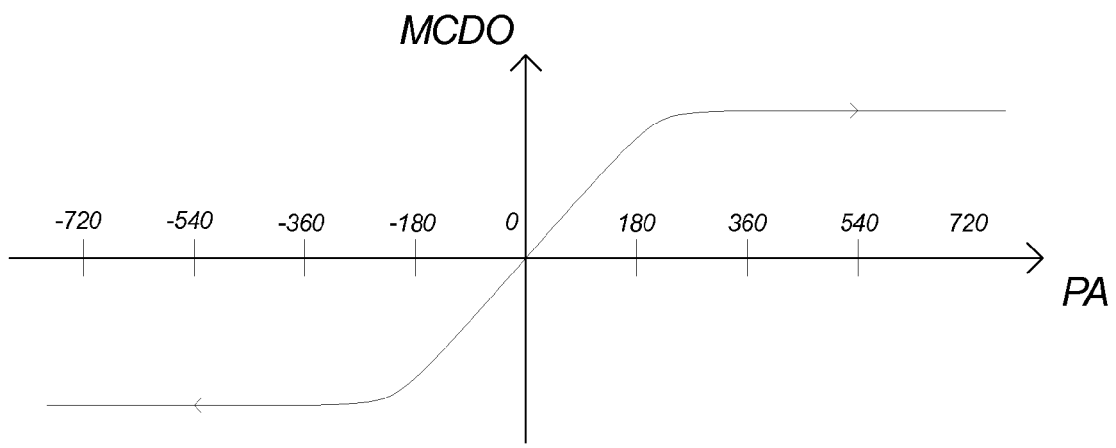
Figure 20C:
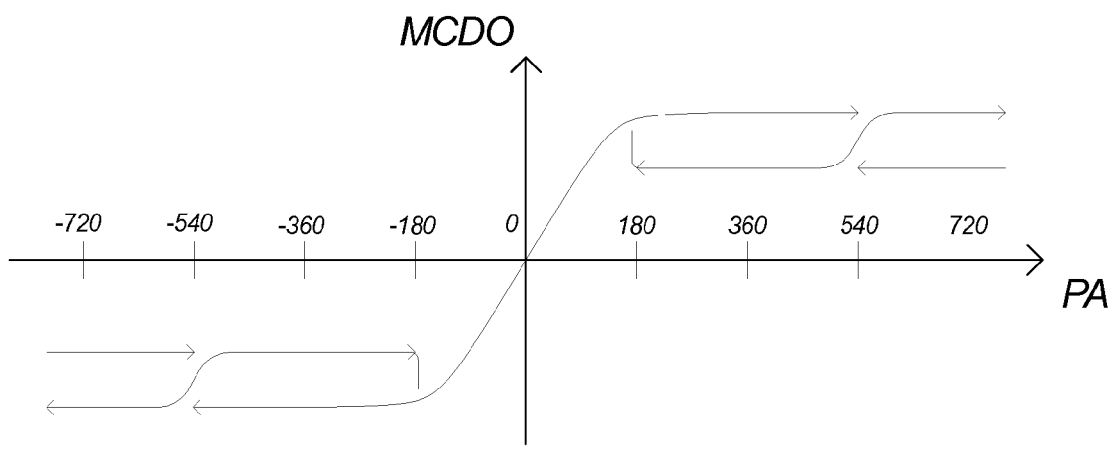

FIGS. 20A-20C shows phase detector transfer characteristics according to the above described embodiments of the Combined Detector of the present invention. The three drawings all comprise a coordinate system, depicting the mean Combined Detector output value MCDO versus the relative phase angle PA of the reference and feedback event clocks in degrees. In all cases a single-wire output from the combinatorial block CMB is assumed, leading to a core linear range of +/−180 degrees.

FIG. 20A shows the output signal CDO when no frame locking is enabled, e.g. as the output of the embodiment shown in FIG. 19A, without the fourth flancter F4. The mean output MCDO moves high when the phase angle PA moves positive, and it moves low when the phase angle PA moves negative. When there is no phase angle PA, i.e. the signals are locked to each other, the mean output MCDO is zero. As the phase detector has no knowledge of frame synchronization, it is impossible to determine whether the phase angle is measured between two corresponding edges.

Therefore it has no meaning to measure phase angles greater than 180 degrees, as this also corresponds to a measure of −180 degrees from the next clock event. To illustrate this dilemma, several possible graphs for the output value are shown in FIG. 20A.

FIG. 20B shows the situation when the full embodiment of FIG. 19A or 19B is implemented. Because of the frame locking ability, the phase detector knows which clock events from each input signal corresponds to each other. Thus it makes sense to measure phase angles much greater than 180 degrees, and therefore the output stays high when the phase angle PA remains positive, and is stays low when the phase angle PA remains negative. The mean output MCDO only equals zero when both frame and clock are locked.

When the frame length N is large, the transfer characteristic of FIG. 20B may lead to slow locking or even instability. This is because the saturation at phase angles beyond +/−180 degrees lowers the effective loop gain. This may result in the phase angle PA swinging from side to side of zero degrees, with a very low damping factor. To improve damping and locking speed, a hysteretic transfer characteristic may be implemented. One such characteristic is shown in FIG. 20C. The mean output MCDO has different values depending not only on the phase angle PA being negative or positive, but also on the direction of the phase angle development, i.e. if it is growing or shrinking. When the phase angle is e.g. 360 degrees and growing, the mean output MCDO has a high positive value, but if it is e.g. 360 degrees and falling, the mean output MCDO has a less-high positive value. This behaviour introduces a phase advance that improves the loop dynamics.

The invention claimed is:

1. A method of establishing an event clock comprising a stream of event-clock pulses, the method comprising the steps of:
   establishing a representation of an idealized clock comprising a stream of target times on a basis of a stream of period control representations by a process that involves accumulation, values of said period control representations representing a desired period of said event clock with respect to that of a master clock,
   establishing a stream of master-clock pointers by justifying said idealized clock to said master clock by a process that involves resolution reduction while performing spectrum control of associated justification jitter, thereby facilitating number-controlled oscillation with improved control of said justification jitter, and
   establishing said stream of event-clock pulses on the basis of said stream of master-clock pointers and said master clock.

2. The method of establishing an event clock according to claim 1, whereby said master clock comprises a single-wire clock.

3. The method of establishing an event clock according to claim 1, whereby said master clock comprises a multiphase clock.

4. The method of establishing an event clock according to claim 1, whereby said resolution reduction comprises wordlength reduction, quantization, truncation or rounding.

5. The method of establishing an event clock according to claim 1, whereby said event-clock pulses are justified to edges of said master clock.

6. The method of establishing an event clock according to claim 1, whereby said event-clock pulses are justified to interpolated phases of said master clock.

7. The method of establishing an event clock according to claim 1, whereby said master-clock pointers are established on a basis of multiple previous period control representations thereby facilitating a continuous accurate establishment of event-clock pulses.

8. The method of establishing an event clock according to claim 1, whereby said master-clock pointers are established on a basis of at least two previous period control representations thereby facilitating accurate control of a mean period between consecutive event-clock pulses.

9. The method of establishing an event clock according to claim 1, whereby said master clock comprises a sequence of master-clock edges, and whereby a clock renderer is synchronized with said master clock, thereby facilitating a selection of those of said master-clock edges that are pointed to by said master-clock pointers.

10. The method of establishing an event clock according to claim 1, whereby said master clock comprises a sequence of master-clock interpolated phases and whereby a clock renderer is synchronized with said master clock, thereby facilitating a selection of those of said master-clock interpolated phases that are pointed to by said master-clock pointers.

11. The method of establishing an event clock according to claim 9, whereby said clock renderer comprises at least one of
   a counter and a comparator,
   a multiplexer, or
   a differentiator and a multi-modulus divider.

12. The method of establishing an event clock according to claim 1, whereby said period control representations are established on a basis of a period control input comprising a continuous-time or analog signal.

13. The method of establishing an event clock according to claim 1, whereby said spectrum control comprises at least one of dithering or noise shaping.

14. A number-controlled oscillator comprising
   an input for a period control signal,
   an input for a master clock signal,
   an output for an event clock signal,
   an accumulator
   a resolution reducer with error signal spectrum control, and
   a clock renderer wherein values of said period control signal represent a desired period of said event clock signal with respect to that of said master clock signal, and wherein said accumulator is arranged to establish a stream of target times comprising a representation of an idealized clock on a basis of said period control signal, wherein said resolution reducer is arranged to establish a stream of master clock pointers by justifying said idealized clock represented by said stream of target times to said master clock while performing spectrum control of associated justification jitter, thereby facilitating number-controlled oscillation with improved control of said justification jitter and wherein said clock renderer is arranged to establish said event clock signal on a basis of said stream of master clock pointers and said master clock signal.

15. The number-controlled oscillator according to claim 14, wherein said master clock signal comprises a single-wire clock.

16. The number-controlled oscillator according to claim 14, wherein said master clock signal comprises a multiphase clock.

17. The number-controlled oscillator according to claim 14, wherein said resolution reducer is arranged to perform at least one of wordlength reduction, quantization, truncation and rounding.

18. The number-controlled oscillator according to claim 14, wherein said master clock signal comprises a sequence of master-clock edges, and whereby said clock renderer is synchronized with said master clock signal, thereby facilitating a selection of those of said master-clock edges that are pointed to by said master-clock pointers.

19. The number-controlled oscillator according to claim 14, wherein said master clock signal comprises a sequence of master-clock interpolated phases and whereby said clock renderer is synchronized with said master clock signal, thereby facilitating a selection of those of said master-clock interpolated phases that are pointed to by said master-clock pointers.

20. The number-controlled oscillator according to claim 14, wherein said spectrum control comprises at least one of dithering and noise shaping.

* * * * *